(12) United States Patent
Akimoto

(10) Patent No.: US 8,525,165 B2
(45) Date of Patent: Sep. 3, 2013

(54) ACTIVE MATRIX DISPLAY DEVICE WITH BOTTOM GATE ZINC OXIDE THIN FILM TRANSISTOR

(75) Inventor: Kengo Akimoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 545 days.

(21) Appl. No.: 12/417,682

(22) Filed: Apr. 3, 2009

(65) Prior Publication Data

US 2009/0189156 A1 Jul. 30, 2009

Related U.S. Application Data

(62) Division of application No. 11/598,669, filed on Nov. 14, 2006.

(30) Foreign Application Priority Data

Nov. 15, 2005 (JP) ................................. 2005-329806

(51) Int. Cl.
*H01L 29/12* (2006.01)
(52) U.S. Cl.
USPC ............. 257/43; 257/443; 257/184; 257/257; 257/290; 257/368; 257/E51.005; 257/291
(58) Field of Classification Search
USPC ................................. 257/184, 257, 290, 368
See application file for complete search history.

(56) References Cited

U.S. PATENT DOCUMENTS

| 5,382,457 A | 1/1995 | Coombe |
| 5,530,265 A | 6/1996 | Takemura |
| 5,660,971 A | 8/1997 | Kobayashi et al. |
| 5,696,011 A | 12/1997 | Yamazaki et al. |
| 5,701,167 A | 12/1997 | Yamazaki |

(Continued)

FOREIGN PATENT DOCUMENTS

| CN | 1388404 | 1/2003 |
| CN | 1445821 | 10/2003 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Eva Yan Montalvo
(74) *Attorney, Agent, or Firm* — Nixon Peabody LLP; Jeffrey L. Costellia

(57) ABSTRACT

To provide a semiconductor device in which a defect or fault is not generated and a manufacturing method thereof even if a ZnO semiconductor film is used and a ZnO film to which an n-type or p-type impurity is added is used for a source electrode and a drain electrode. The semiconductor device includes a gate insulating film formed by using a silicon oxide film or a silicon oxynitride film over a gate electrode, an Al film or an Al alloy film over the gate insulating film, a ZnO film to which an n-type or p-type impurity is added over the Al film or the Al alloy film, and a ZnO semiconductor film over the ZnO film to which an n-type or p-type impurity is added and the gate insulating film.

29 Claims, 16 Drawing Sheets

(56) References Cited

U.S. PATENT DOCUMENTS

| | | | |
|---|---|---|---|
| 5,731,856 A | 3/1998 | Kim et al. | |
| 5,803,975 A | 9/1998 | Suzuki | |
| 5,817,548 A | 10/1998 | Noguchi et al. | |
| 5,888,410 A | 3/1999 | Ishihara et al. | |
| 5,930,607 A | 7/1999 | Satou | |
| 5,952,708 A * | 9/1999 | Yamazaki | 257/643 |
| 5,994,157 A | 11/1999 | Aggas et al. | |
| 6,294,274 B1 | 9/2001 | Kawazoe et al. | |
| 6,459,418 B1 | 10/2002 | Comiskey et al. | |
| 6,496,242 B1 | 12/2002 | Moon | |
| 6,529,251 B2 | 3/2003 | Hibino et al. | |
| 6,532,045 B2 | 3/2003 | Chung et al. | |
| 6,563,174 B2 | 5/2003 | Kawasaki et al. | |
| 6,617,796 B2 | 9/2003 | Sasaki et al. | |
| RE38,292 E | 10/2003 | Satou | |
| 6,674,136 B1 | 1/2004 | Ohtani | |
| 6,727,522 B1 | 4/2004 | Kawasaki et al. | |
| 6,819,368 B2 | 11/2004 | Chae | |
| 6,852,998 B2 | 2/2005 | Sung et al. | |
| 6,888,586 B2 | 5/2005 | Yoo et al. | |
| 6,900,461 B2 | 5/2005 | Inoue et al. | |
| 6,921,627 B2 | 7/2005 | Tada et al. | |
| 7,009,204 B2 | 3/2006 | Tsai et al. | |
| 7,012,658 B2 | 3/2006 | Sawasaki et al. | |
| 7,019,735 B2 | 3/2006 | Sasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,067,843 B2 | 6/2006 | Carcia et al. | |
| 7,075,614 B2 | 7/2006 | Izumi et al. | |
| 7,105,868 B2 | 9/2006 | Nause et al. | |
| 7,189,992 B2 | 3/2007 | Wager, III et al. | |
| 7,211,825 B2 | 5/2007 | Shih et al | |
| 7,264,979 B2 | 9/2007 | Yamagata et al. | |
| 7,268,842 B2 | 9/2007 | Sawasaki et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,330,234 B2 | 2/2008 | Murakami et al. | |
| 7,339,187 B2 | 3/2008 | Wager, III et al. | |
| 7,365,805 B2 | 4/2008 | Maekawa et al. | |
| 7,385,224 B2 | 6/2008 | Ishii et al. | |
| 7,391,055 B1 | 6/2008 | Murakami et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,456,430 B1 | 11/2008 | Yamazaki et al. | |
| 7,462,862 B2 | 12/2008 | Hoffman et al. | |
| 7,468,304 B2 | 12/2008 | Kaji et al. | |
| 7,470,607 B2 | 12/2008 | Carcia et al. | |
| 7,485,478 B2 | 2/2009 | Yamagata et al. | |
| 7,501,293 B2 | 3/2009 | Ito et al. | |
| 7,560,396 B2 | 7/2009 | Sugawara et al. | |
| 7,566,904 B2 | 7/2009 | Ishii | |
| 7,585,698 B2 | 9/2009 | Ishii | |
| 7,633,471 B2 | 12/2009 | Yamazaki et al. | |
| 7,732,818 B2 | 6/2010 | Maekawa et al. | |
| 7,825,419 B2 | 11/2010 | Yamagata et al. | |
| 7,855,380 B2 | 12/2010 | Yamazaki et al. | |
| 7,888,207 B2 | 2/2011 | Wager, III et al. | |
| 2001/0046027 A1 | 11/2001 | Tai et al. | |
| 2002/0011978 A1 | 1/2002 | Yamazaki et al. | |
| 2002/0044111 A1 | 4/2002 | Yamazaki et al. | |
| 2002/0056838 A1 | 5/2002 | Ogawa | |
| 2002/0106839 A1 | 8/2002 | Tsujimura et al. | |
| 2002/0109796 A1 * | 8/2002 | Lin et al. | 349/43 |
| 2002/0110703 A1 | 8/2002 | Tada et al. | |
| 2002/0132454 A1 | 9/2002 | Ohtsu et al. | |
| 2003/0047785 A1 | 3/2003 | Kawasaki et al. | |
| 2003/0207506 A1 | 11/2003 | Satou | |
| 2003/0218222 A1 | 11/2003 | Wager, III et al. | |
| 2004/0038446 A1 | 2/2004 | Takeda et al. | |
| 2004/0113227 A1 | 6/2004 | Goto et al. | |
| 2004/0127038 A1 | 7/2004 | Carcia et al. | |
| 2004/0132293 A1 | 7/2004 | Takayama et al. | |
| 2004/0252270 A1 | 12/2004 | Lee | |
| 2005/0012097 A1 | 1/2005 | Yamazaki | |
| 2005/0017302 A1 | 1/2005 | Hoffman | |
| 2005/0062134 A1 | 3/2005 | Ho et al. | |
| 2005/0082541 A1 | 4/2005 | Satou | |
| 2005/0084999 A1 | 4/2005 | Satou | |
| 2005/0094048 A1 | 5/2005 | Baek | |
| 2005/0104071 A1 | 5/2005 | Satou | |
| 2005/0127380 A1 | 6/2005 | Kawasaki et al. | |
| 2005/0140840 A1 | 6/2005 | Hirakata et al. | |
| 2005/0164423 A1 | 7/2005 | Maekawa et al. | |
| 2005/0199959 A1 | 9/2005 | Chiang et al. | |
| 2005/0231107 A1 | 10/2005 | Yamazaki et al. | |
| 2005/0233509 A1 | 10/2005 | Satou | |
| 2005/0250308 A1 | 11/2005 | Yamaguchi et al. | |
| 2005/0259206 A1 | 11/2005 | Son | |
| 2005/0275038 A1 | 12/2005 | Shih et al. | |
| 2006/0035452 A1 * | 2/2006 | Carcia et al. | 438/608 |
| 2006/0043377 A1 | 3/2006 | Hoffman et al. | |
| 2006/0054888 A1 | 3/2006 | Ito et al. | |
| 2006/0081844 A1 | 4/2006 | Hirosue et al. | |
| 2006/0086933 A1 | 4/2006 | Iechi et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0163743 A1 | 7/2006 | Kuwabara et al. | |
| 2006/0169973 A1 | 8/2006 | Isa et al. | |
| 2006/0170067 A1 | 8/2006 | Maekawa et al. | |
| 2006/0170111 A1 | 8/2006 | Isa et al. | |
| 2006/0183274 A1 | 8/2006 | Carcia et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0249733 A1 | 11/2006 | Yamazaki et al. | |
| 2006/0284171 A1 | 12/2006 | Levy et al. | |
| 2006/0284172 A1 | 12/2006 | Ishii | |
| 2006/0286737 A1 | 12/2006 | Levy et al. | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0141784 A1 | 6/2007 | Wager, III et al. | |
| 2007/0152217 A1 | 7/2007 | Lai et al. | |
| 2007/0158652 A1 | 7/2007 | Lee et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0238228 A1 | 10/2007 | Su et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager, III et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0174710 A1 | 7/2008 | Murakami et al. | |
| 2008/0182358 A1 | 7/2008 | Cowdery-Corvan et al. | |
| 2008/0198108 A1 | 8/2008 | Aoki | |

| | | | |
|---|---|---|---|
| 2008/0224133 A1 | 9/2008 | Park et al. | |
| 2008/0246407 A1 | 10/2008 | Yoshida et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0114911 A1 | 5/2009 | Maekawa et al. | |
| 2009/0134399 A1 | 5/2009 | Sakakura et al. | |
| 2009/0152541 A1 | 6/2009 | Maekawa et al. | |
| 2009/0153762 A1 | 6/2009 | Kuwabara et al. | |
| 2009/0186437 A1 | 7/2009 | Akimoto | |
| 2009/0186445 A1 | 7/2009 | Akimoto | |
| 2009/0189155 A1 | 7/2009 | Akimoto | |
| 2009/0239335 A1 | 9/2009 | Akimoto et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0003783 A1 | 1/2010 | Akimoto | |
| 2010/0038639 A1 | 2/2010 | Akimoto | |
| 2010/0085283 A1 | 4/2010 | Yamazaki et al. | |
| 2010/0240157 A1 | 9/2010 | Maekawa et al. | |
| 2011/0012119 A1 | 1/2011 | Yamazaki et al. | |
| 2011/0024787 A1 | 2/2011 | Yamagata et al. | |

FOREIGN PATENT DOCUMENTS

| | | |
|---|---|---|
| CN | 1522470 | 8/2004 |
| CN | 1564324 | 1/2005 |
| CN | 1656618 | 8/2005 |
| EP | 0 641 028 A2 | 3/1995 |
| EP | 1 033 755 A2 | 9/2000 |
| EP | 1 045 451 A2 | 10/2000 |
| EP | 1 052 701 A2 | 11/2000 |
| EP | 1134811 A1 | 9/2001 |
| EP | 1 209 748 A1 | 5/2002 |
| EP | 1 737 044 A1 | 12/2006 |
| EP | 1 780 589 A2 | 5/2007 |
| EP | 1 786 037 A2 | 5/2007 |
| EP | 2 226 847 A2 | 9/2010 |
| EP | 2 246 894 A1 | 11/2010 |
| EP | 2 256 817 A2 | 12/2010 |
| EP | 2 259 135 A2 | 12/2010 |
| JP | 60-170972 | 9/1985 |
| JP | 62-252973 | 11/1987 |
| JP | 01-236655 | 9/1989 |
| JP | 02-262729 | 9/1990 |
| JP | 04-302435 A | 10/1992 |
| JP | 05-251705 | 9/1993 |
| JP | 06-088972 | 3/1994 |
| JP | 07-066417 | 3/1995 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-037268 | 2/2003 |
| JP | 2003-086808 | 3/2003 |
| JP | 2003-298062 | 10/2003 |
| JP | 2004-273614 | 9/2004 |
| JP | 2004-273732 | 9/2004 |
| JP | 2005-033172 | 2/2005 |
| JP | 2005-077822 | 3/2005 |
| JP | 2005-252012 | 9/2005 |
| JP | 2005-302808 | 10/2005 |
| JP | 2006-502597 | 1/2006 |
| JP | 2006-344849 | 12/2006 |
| KR | 2001-0006970 A | 1/2001 |
| KR | 2001-0104294 | 11/2001 |
| KR | 2002-0023821 | 3/2002 |
| KR | 2002-0038482 | 5/2002 |
| KR | 2002-0067670 | 8/2002 |
| KR | 2002-0067976 A | 8/2002 |
| KR | 2005-0052449 | 6/2005 |
| KR | 2005-0056234 | 6/2005 |
| KR | 2005-0077037 | 7/2005 |
| TW | 200410297 | 6/2004 |
| TW | I238375 | 8/2005 |
| WO | WO-97/13177 | 4/1997 |
| WO | WO 03/040441 A1 | 5/2003 |
| WO | WO-03/088345 | 10/2003 |
| WO | WO 2004/034449 A2 | 4/2004 |
| WO | WO 2004/038757 A2 | 5/2004 |
| WO | WO 2005/088726 A1 | 9/2005 |
| WO | WO 2006/062180 A1 | 6/2006 |
| WO | WO-2006/132439 A1 | 12/2006 |

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Invitation to Pay Additional Fees and Communication Relating to the Results of the Partial International Search, PCT/JP2006/323042, Dated Dec. 12, 2006.

Kenji Nomura et al., "Thin Film Transistor Fabricated in Single-Crystalline Transparent Oxide Semiconductor", Science, May 23, 2003, vol. 300, pp. 1269-1272.

Kenji Nomura et al., "Room-Temperature Fabrication of Transparent Flexible Thin-Film Transistors Using Amorphous Oxide Semiconductors", Nature, Nov. 25, 2004, vol. 432, pp. 488-492.

Satoshi Masuda et al., "Transparent Thin Film Transistors Using ZnO as an Active Channel Layer and their Electrical Properties", Journal of Applied Physics, Feb. 1, 2003, vol. 93, No. 3, pp. 1624-1630.

Office Action (Application No. 2006-80037580.5) Dated Apr. 24, 2009 with English translation.

N. Kimizuka et al., "Syntheses and Single-Crystal Data of Homologous Compounds, $In_2O_3(ZnO)_m$(m=3,4, and 5), $InGaO_3(ZnO)_3$, and $Ga_2O_3(ZnO)_m$ (m=7,8,9, and 16) in the $In_2O_3$-$ZnGa_2O_4$-ZnO System", Journal of Solid State Chemistry, Jan. 1, 1995, pp. 170-178, vol. 116.

N. Asakuma et al., "Crystallization and Reduction of Sol-Gel-Derived Zinc Oxide Films by Irradiation with Ultraviolet Lamp", Journal of Sol-Gel Science and Technology, Jan. 1, 2003, pp. 181-184, vol. 26.

C. Li et al., "Modulated Structures of Homologous Compounds $InMO_3(ZnO)_m$,(M=In, Ga; m=Integer) Described by Four-Dimensional Superspace Group", Journal of Solid State Chemistry, Jan. 1, 1998, pp. 347-355, vol. 139.

T. Kamiya et al., "1a-F-5 Room Temperature Fabrication and Carrier Transport of Amorphous Semiconductor Exhibiting Large Electron hall Mobilities > 10 cm2/Vs", The Japan Society of Applied Physics (The 65th Autumn Meeting, 2004), No. 2, Sep. 1, 2004, pp. 791.

K. Nomura et al., 3 1a-ZA-6 Carrier Transport in Transparent Amorphous Oxide Semiconductor $InGaZnO_4$, The Japan Society of Applied Physics and Related Societies (The 51st Spring Meeting, 2004), No. 2, pp. 669, Mar. 28, 2004.

Specification and Preliminary Amendment (U.S. Appl. No. 12/542,068; US9053-C8 (U14743) dated Aug. 17, 2009.

Office Action (U.S. Appl. No. 11/598,669) dated Sep. 4, 2009.

Office Action, Notification of the Second Office Action (Chinese Application No. 200680037580.5) dated Jan. 8, 2010 with English translation.

Office Action (U.S. Appl. No. 11/598,669) dated Mar. 5, 2010.

Office Action (U.S. Appl. No. 12/411,900) dated Jan. 3, 2011.

Office Action (U.S. Appl. No. 12/411,957) dated Dec. 27, 2010.

Office Action (U.S. Appl. No. 11/598,669) dated Feb. 23, 2011.

Office Action (U.S. Appl. No. 12/562,160) dated Mar. 16, 2011.

Chinese Office Action (Application No. 200910129859.1) dated Mar. 9, 2011.

Office Action (U.S. Appl. No. 12/411,957; US09156-D4) dated May 27, 2010.

Office Action (Application No. 200680037580.5;PCTCN09156) Dated May 10, 2010.

Office Action (U.S. Appl. No. 12/417,677) Dated May 25, 2011.

Office Action (U.S. Appl. No. 11/598,669) mailed Jul. 26, 2011.

Office Action (U.S. Appl. No. 12/562,160) mailed Aug. 18, 2011.
Korean Office Action (Application No. 2009-7007664;PCTKR09156D4) Dated Jul. 28, 2011.
Chinese Office Action for Application No. 2009-10208851.4, Dated: Jan. 14, 2011 with English Translation.
Korean Office Action for Application No. 2009-7006657, Dated: Jan. 3, 2011 with English Translation.
Korean Office Action for Application No. 2009-7007324, Dated: Jan. 3, 2011 with English Translation.
Korean Office Action for Application No. 2009-7019975, Dated: Jan. 20, 2011 with English Translation.
Korean Office Action for Application No. 2009-7022582, Dated: Jan. 20, 2011 with English Translation.
Office Action (U.S. Appl. No. 12/411,900) Dated Jun. 3, 2011.
Chang.S et al., "Patterning of zinc oxide thin films.", Solid State Sensor and Workshop, Jun. 22, 1992, pp. 41-45.
Office Action (Application No. 200910129860.4;PCTCN09156D4) Dated May 7, 2010.
Ueno.K et al., "Field-Effect Transistor on $SrTiO_3$ With Sputtered $Al_2O_3$ Gate Insulator," (Applied Physics Letters), Sep. 1, 2003, vol. 83, No. 9, pp. 1755-1757.
Park.J et al., "Dry etching of ZnO films and plasma-induced damage to optical properties,", J.Vac.Sci.Technol., Mar. 1, 2003, vol. B21, No. 2, pp. 800-803.
Ogata.K et al., "Electron-cyclotron-resonance plasma etching of the ZnO layers grown by molecular-beam epitaxy,", J.Vac.Sci.Technol. A, May 1, 2004, vol. 22, No. 3, pp. 531-533.
Kenji Nomura et al., "Carrier Transport in Transparent Oxide Semiconductor with Intrinsic Structural Randomness Probed Using Single-Crystalline $InGaO_3(ZnO)_5$ Films", Applied Physics Letters, Sep. 13, 2004, pp. 1993-1995, vol. 85, No. 11.
"Korean Office Action (Application No. 2009-7006656;PCTKR09156D2) Dated Aug. 17, 2011".
"Korean Office Action (Application No. 2009-7006657;PCTKR09156D3) Dated Aug. 25, 2011".
"Korean Office Action (Application No. 2009-7007324;PCTKR09156D5) Dated Aug. 26, 2011".
Office Action (U.S. Appl. No. 12/417,677) mailed Nov. 16, 2011.
Office Action (U.S. Appl. No. 12/606,281) mailed Nov. 23, 2011.
Taiwanese Office Action (Application No. 98110673; TW09156D1) Dated Oct. 31, 2012.
Taiwanese Office Action (Application No. 98110709; TW09156D5) Dated Oct. 31, 2012.
Taiwanese Office Action (Application No. 98110679; TW09156D2) Dated Oct. 31, 2012.
Taiwanese Office Action (Application No. 98110683; TW09156D3) Dated Oct. 31, 2012.
Taiwanese Office Action (Application No. 98136152; TW09156D7) Dated Oct. 31, 2012.
Taiwanese Office Action (Application No. 98110687; TW09156D4) Dated Oct. 31, 2012.
Taiwanese Office Action (Application No. 98132929; TW09156D6) Dated Oct. 31, 2012.
Office Action, U.S. Appl. No. 12/606,281, mailed May 7, 2012.

* cited by examiner

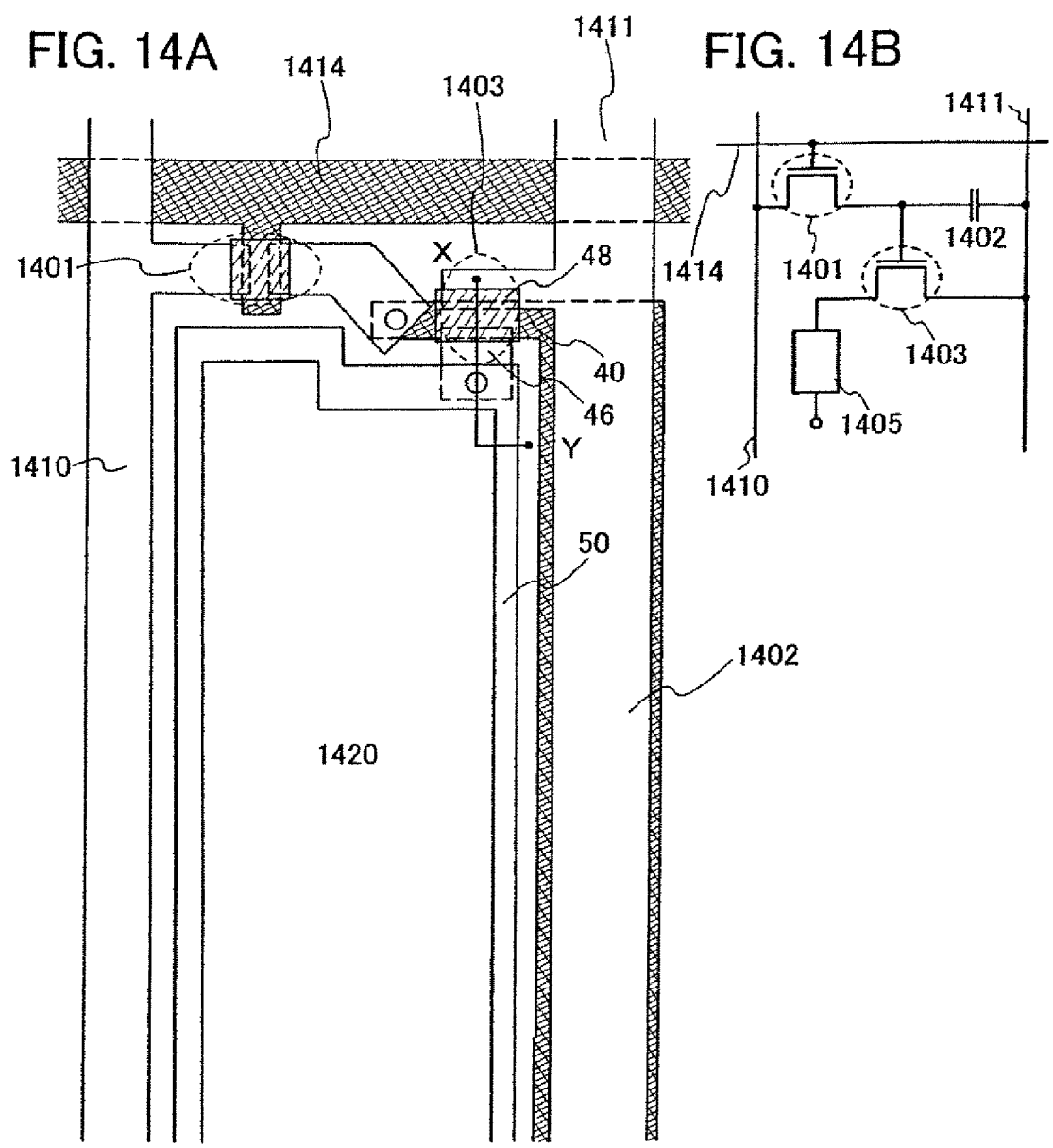

ACTIVE MATRIX DISPLAY DEVICE WITH BOTTOM GATE ZINC OXIDE THIN FILM TRANSISTOR

TECHNICAL FIELD

The present invention relates to a semiconductor device using ZnO (Zinc Oxide) and a manufacturing method thereof.

BACKGROUND ART

A semiconductor device used for a display panel of a liquid crystal display device or an EL (Electroluminescent) display device, for example, a semiconductor portion of a TFT (Thin Film Transistor), is generally formed by using a-Si (amorphous silicon) or poly-Si (polycrystalline silicon).

Si (silicon) does not have a large band gap (for example, single-crystalline Si is 1.1 eV), and absorbs visible light. By irradiation with the light, electrons and holes (carriers) are formed in Si. If a Si film is used for a channel formation region of a TFT, a carrier is generated in the channel formation region by irradiation with the light even in an OFF state. Then, current flows between a source region and a drain region. The current which flows in an OFF state is called "OFF-leak current". If the current value is high, a display panel does not operate normally. Consequently, a light shielding film is formed so as not to irradiate the Si film with light. However, a process becomes complex when the light shielding film is formed, because a deposition step, a photolithography step, and an etching step are required.

To solve the problem, an attention is paid to a transparent transistor using zinc oxide (ZnO) which is a semiconductor having a larger band gap of 3.4 eV than that of Si. Concerning such a transparent transistor, the band gap is larger than light energy in a visible light band and the visible light is not absorbed. Consequently, it has an advantage that the OFF-leak current does not increase if irradiated with light.

A semiconductor device using ZnO for the channel formation region is disclosed in Reference 1, for example. The structure of the semiconductor device using ZnO is described referring to FIG. 7A.

A semiconductor device in FIG. 7A has a source electrode 1001 and a drain electrode 1002, a ZnO layer 1003 arranged so as to be contacted with the source electrode 1001 and the drain electrode 1002, and a gate insulating layer 1004 stacked over the ZnO layer 1003 and a gate electrode 1005 over an insulating substrate 1000 such as a glass substrate.

For the source electrode 1001 and the drain electrode 1002, a conductive ZnO is used. The conductive ZnO is doped with one of the following: B(boron), Al (aluminum), Ga (gallium), In (indium), or Tl (thallium), which are III group elements; F(fluorine), Cl (chlorine), Br (bromine), or I (iodine), which are VII group elements; Li (lithium), Na (sodium), K (potassium), Rb (rubidium), or Cs (caesium), which are I group elements; and N (nitrogen), P (phosphorus), As (arsenic), Sb (antimony), or Bi (bismuth), which are V group elements.
[Reference 1] Japanese Published Patent Application No. 2000-150900

DISCLOSURE OF INVENTION

According to the examination by the present inventor, it was revealed that the substrate 1000 is etched in some cases when the source electrode 1001 and the drain electrode 1002 of the top gate semiconductor device shown in FIG. 7A is formed by etching. Even in the case of forming a base film 1006 formed by using a silicon oxide film or a silicon oxynitride film on the substrate 1000, the surface of the substrate 1000 is exposed in some cases when the base film is etched. In addition, in the case of a bottom gate semiconductor device shown in FIG. 7B, it is revealed that a gate insulating film 1004 formed by using a silicon oxide film or a silicon oxynitride film is etched when a source electrode 1001 and a drain electrode 1002 are formed by etching.

It the case of the top gate semiconductor device, when the glass substrate 1000 or the base film 1006 formed by using a silicon oxide film or a silicon oxynitride film is etched, an impurity such as sodium is diffused into a semiconductor film 1003 from the substrate 1000, so that characteristics are deteriorated.

In the case of the bottom gate semiconductor device (FIG. 7B), if the gate insulating film 1004 is etched when the source electrode 1001 and the drain electrode 1002 are formed by etching, the characteristics are not stable and causes a fault.

In consideration of the above situation, it is an object of the present invention to provide a semiconductor device in which a defect or a fault is not generated and a manufacturing method thereof even if a ZnO semiconductor film is used for the channel formation region, and a ZnO film to which an n-type or p-type impurity is added is used for the source electrode and the drain electrode.

An aspect of a semiconductor device of this invention has an Al film or an Al alloy film over a silicon oxide film or a silicon oxynitride film, and a ZnO film to which an n-type or p-type impurity is added over the Al film or the Al alloy film. "A silicon oxide film", "a silicon oxynitride film", "an Al film", "an Al alloy film" and "a ZnO film" in this specification means a film containing silicon oxide, a film containing silion oxynitride, a film containing Al, a film containing Al alloy, a film containing ZnO, respectively.

An aspect of a semiconductor device of this invention has a gate insulating film formed by using a silicon oxide film or a silicon oxynitride film over a gate electrode, an Al film or an Al alloy film over the gate insulating film, a ZnO film to which an n-type or p-type impurity is added over the Al film or the Al alloy film, and a ZnO semiconductor film over the ZnO film to which an n-type or p-type impurity is added and the gate insulating film.

An aspect of a semiconductor device of this invention has an Al film or an Al alloy film over a silicon oxide film or a silicon oxynitride film, a ZnO film to which an n-type or p-type impurity is added over the Al film or the Al alloy film, a ZnO semiconductor film over the silicon oxide film or the silicon oxynitride film and the ZnO film to which an n-type or p-type impurity is added, a gate insulating film over the ZnO semiconductor film, and a gate electrode over the gate insulating film.

An aspect of a manufacturing method of a semiconductor device of this invention has the steps of: forming a silicon oxide film or a silicon oxynitride film; forming an Al film or an Al alloy film over the silicon oxide film or the silicon oxynitride film; forming a ZnO film to which an n-type or p-type impurity is added over the Al film or the Al alloy film, wherein the ZnO film to which an n-type or p-type impurity is added is etched to have an island-like shape by a first etching, and the Al film or the Al alloy film is etched to have an island-like shape by a second etching.

An aspect of a manufacturing method of a semiconductor device of this invention, wherein a ZnO semiconductor film is formed over the ZnO film to which an n-type or p-type impurity is added, and the silicon oxide film or the silicon oxynitride film after the second etching.

In the case of the bottom gate semiconductor device, a gate insulating film formed by using the silicon oxide film or the silicon oxynitride film is formed over the gate electrode after forming a gate electrode.

In the case of the top gate semiconductor device, a gate insulating film is formed and a gate electrode is formed after the ZnO semiconductor film is formed.

A first etching of this invention may be wet etching.

A first etching of this invention may be wet etching using buffered fluoric acid.

A first etching of this invention may be dry etching.

A first etching of this invention may be dry etching using $CH_4$ (methane) gas.

A second etching of this invention may be wet etching.

A second etching of this invention may be wet etching using developing solution for a photoresist.

A second etching of this invention may be wet etching using an organic alkaline solution.

A second etching of this invention may be wet etching using TMAH (tetramethylammonium hydroxide).

An aspect of a semiconductor device of this invention has a gate electrode, a gate insulating film over the gate electrode, a first film comprising metal material over the gate insulating film, a second film comprising a transparent semiconductor material and an n-type or p-type impurity over the first film, and a third film comprising the transparent semiconductor material over the second film and the gate insulating film.

An aspect of a semiconductor device of this invention has an insulating film over a substrate, a first film comprising a metal material over the insulating film, a second film comprising a transparent semiconductor material and an n-type or p-type impurity over the metal film, a third film comprising the transparent semiconductor material over the insulating film and the second film, a gate insulating film over the third film, and a gate electrode over the gate insulating film.

An aspect of a manufacturing method of a semiconductor device of this invention has the steps of: forming an insulating film over a substrate, forming a first film comprising a metal material over the insulating film, forming a second film comprising a transparent semiconductor material and an n-type or p-type impurity over the first film, etching the second film, and etching the first film.

An aspect of a manufacturing method of a semiconductor device of this invention has the steps of: forming a gate electrode over a substrate, forming a gate insulating film over the gate electrode, forming a first film comprising a metal material over the gate insulating film, forming a second film comprising a transparent semiconductor material and an n-type or p-type impurity over second film, etching the second film, and etching the first film.

In the top gate semiconductor device, a base film formed by using a glass substrate, a silicon oxide film or a silicon oxynitride film is not etched, and an impurity such as sodium is not diffused from a substrate into a semiconductor film so that its characteristics are not deteriorated.

In the bottom gate semiconductor device, the gate insulating film is not etched and its characteristics do not become unstable.

Since Al is used for a part of the source electrode and drain electrode, low resistance of a wire can be obtained.

BRIEF DESCRIPTION OF DRAWINGS

In the accompanying drawings:

FIG. 14A illustrates a top front view of a pixel portion and FIG. 14B illustrates an equivalent circuit of a light-emitting device;

The embodiments of this invention will be described hereinafter referring to the accompanying drawings. Note that this invention is not limited to the description below, and it is easily understood by those skilled in the art that the embodiments and details herein disclosed can be modified in various ways without departing from the purpose and the scope of the invention. Therefore, this invention should not be interpreted as being limited to the description of the embodiments to be given below.

BEST MODE FOR CARRYING OUT THE INVENTION

Embodiment 1

Here, a bottom gate semiconductor device is described.

Figure 1A:
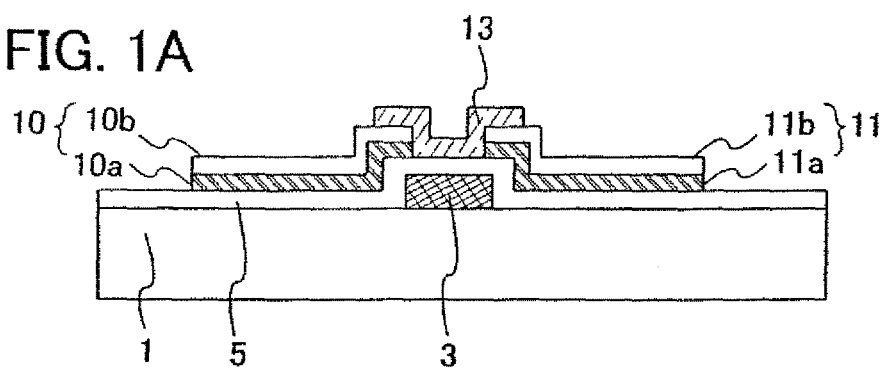
FIGS. 1A and 1B show semiconductor devices of this invention.

FIG. 1A is a cross-sectional view in which one example of the embodiment of this invention is shown. In FIG. 1A, numeral reference 1 denotes a substrate, 3 denotes a gate electrode, 5 denotes a gate insulating film, 10 denotes a source electrode, 10*a* denotes a first conductive film, 10*b* denotes a second conductive film, 11 denotes a drain electrode, 11*a* denotes a first conductive film, 11*b* denotes a second conductive film, and 13 denotes a semiconductor film. An insulating film for passivation or planarization may be formed over the semiconductor film 13.

The gate electrode 3 is formed over the substrate 1, the gate insulating film 5 is formed over the gate electrode 3, and the source electrode 10 and the drain electrode 11 are formed over the gate insulating film 5. The source electrode 10 is formed of a layered film having the first conductive film 10*a* and the second conductive film 10*b*, and the drain electrode 11 is formed of a layered film having the first conductive film 11a and the second conductive film 11b. A third conductive film may be formed between the first conductive film 10a and the second conductive film 10b, or between the first conductive film 11a and the second conductive film 11b. The source electrode 10 and the drain electrode 11 may be each formed so as to overlap partially with the gate electrode 3 through the gate insulating film 5. The semiconductor film 13 is formed over the source electrode 10 and the drain electrode 11 over the gate insulating film 5.

Hereinafter, each structure is described.

(1) Substrate

The following can be used for forming a substrate: a substrate formed by using a glass substrate; an insulating material such as alumina; and a plastic substrate which can resist a processing temperature in post-steps; and the like. In the case of using a plastic substrate for the substrate 1, the following can be used: PC (polycarbonate); PES (polyethersulfone); PET (polyethylene terephthalate); PEN (polyethylene naphthalate); or the like. In the case of the plastic substrate, an inorganic layer or an organic layer may be provided as a gas barrier layer over the surface. In the case where a prominence due to dust or the like which is generated on the substrate in the manufacturing process of the plastic substrate, the substrate may be used after polishing it with CMP or the like to make its surface planarized. An insulating film such as silicon oxide (SiOx), silicon nitride (SiNx), silicon oxynitride (SiOxNy) (X>Y), and silicon nitride oxide (SiNxOy) (X>Y) may be formed over the substrate 1 for preventing an impurity or the like from diffusing from the substrate side.

(2) Gate Electrode

A gate electrode can be formed by using an Al (aluminum) film, a W (tungsten) film, a Mo (molybdenum) film, a Ta (tantalum) film, a Cu (copper) film, a Ti (titanium) film, an alloy material containing the elements as a main component (for example, an Al alloy film, a MoW (molybdenum tungsten) alloy film), or the like. A semiconductor film represented by a polycrystalline silicon film doped with an impurity element such as P (phosphourus) may be used. The gate electrode 3 may be a single layer or a layered film in which two or more layers are stacked.

(3) Gate Insulating Film

The gate insulating film 5 is formed by using an insulating film containing silicon as a main component, for example, silicon oxide film, and silicon oxynitride film. In addition, it may be a single layer or a layered film.

(4) Source Electrode and Drain Electrode

The source electrode 10 is formed with a layered film of the first conductive film 10a and the second conductive film 10b, and the drain electrode 11 is formed with a layered film of the first conductive film ha and the second conductive film 11b.

As the first conductive film, an Al film, an Al alloy film such as an AlNi (aluminum nickel) film, and an AlNd (neodymium aluminum) film can be used. As the second conductive film, ZnO (zinc oxide) to which a p-type or n-type impurity of B (boron), Al (aluminum), Ga (gallium), P phosphorus), or As (arsenic) is added can be used. A metal film such as a Ti film may be provided as a third conductive film between the first conductive film and the second conductive film.

(5) Semiconductor Film

A ZnO film is used as a semiconductor film. Since the source electrode and the drain electrode contacted with the semiconductor film have the ZnO film to which a p-type or n-type impurity is added, they can be easily connected with the semiconductor film.

(6) Insulating Film

An insulating film such as a passivation film and a planarization film may be formed over the semiconductor film 13, although not shown. Silicon oxide (SiOx), silicon nitride (SiNx), silicon oxynitride (SiOxNy) (x>y), silicon nitride oxide (SiNxOy) (x>y), a SOG (spin-on-glass) film, or an organic resin film of acryl, or a layered film of those can be used.

In the bottom gate semiconductor device, a gate insulating film is not etched in manufacturing process, and characteristics do not become unstable. Al is used for a part of the source electrode and the drain electrode, thereby achieving lower resistance of a wire.

Embodiment 2

Here, a top gate semiconductor device is described.

Figure 1B:
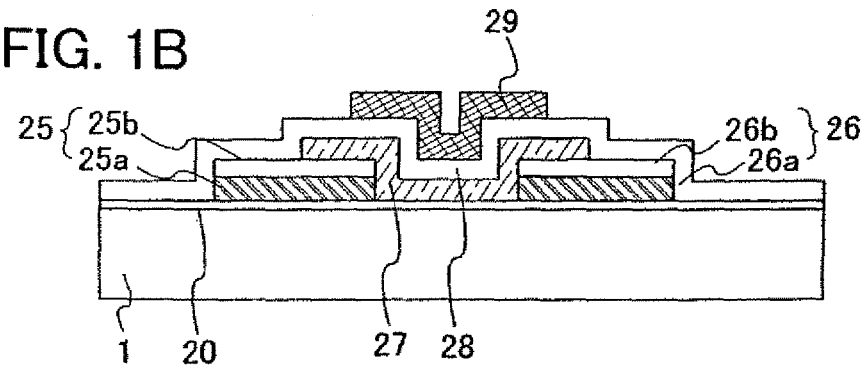

FIG. 1B is a cross-sectional view showing one example of an embodiment of this invention. In FIG. 1B, numeral reference 1 denotes a substrate, 20 denotes an insulating film, 25 denotes a source electrode, 25a denotes a first conductive film, 25b denotes a second conductive film, 26 denotes a drain electrode, 26a denotes a first conductive film, 26b denotes a second conductive film, 27 denotes a semiconductor film, 28 denotes a gate insulating film, and 29 denotes a gate electrode. An insulating film for passivation or planarization may be formed over the gate electrode.

The insulating film 20 is formed on the substrate 1, and the source electrode 25 and the drain electrode 26 are formed over the insulating film 20. The source electrode 25 is formed with a layered film of the first conductive film 25a and the second conductive film 25b, and the drain electrode 26 is formed with a layered film of the first conductive film 26a and the second conductive film 26b. A third conductive film may be formed between the first conductive film 25a and the second conductive film 25b, or between the first conductive film 26a and the second conductive film 26b. The semiconductor film 27 is formed over the source electrode 25 and the drain electrode 26 over the insulating film 20, the gate insulating film 28 is formed over the semiconductor film 27, and the gate electrode 29 is formed over the gate insulating film 28. The gate electrode 29 may be formed so as to partially overlap with the source electrode and the drain electrode with the gate insulating film 28 and the semiconductor film 27 interposed therebetween.

Here, each structure is described.

For the substrate, the source electrode, the drain electrode, the semiconductor film, and the gate electrode, the same ones described in Embodiment 1 can be used.

(1) Insulating Film Over Substrate

An silicon oxide film or a silicon oxynitride film is formed as the insulating film 20 for preventing an impurity or the like from diffusing from the substrate side over the substrate 1. In addition, it may be a single layer or a layered film.

(2) Gate Insulating Film

The gate insulating film 28 is formed by using an insulating film containing silicon as a main component, for example, a silicon oxide film, a silicon oxynitride film, a silicon nitride oxide film, and a silicon nitride film. In addition, it may be a single layer or a layered film.

(3) Insulating Film Over Gate Electrode

An interlayer insulating film such as a passivation film and a planarization film may be formed over the gate electrode 29, although not shown. A $SiO_x$ film, a SiNx film, a SiON film, SiNO film, an SOG (spin-on-glass) film, and an organic resin film of acrylic or a layered film of those can be used.

In the top gate semiconductor device, the substrate or the base film formed by using a silicon oxide film or a silicon oxynitride film is not etched, so that an impurity such as sodium is not diffused into the semiconductor film from the substrate and the characteristics are not deteriorated. Al is used for a part of the source electrode and the drain electrode, thereby achieving lower resistance of a wire.

Embodiment 3

A manufacturing method of the bottom gate semiconductor device is described, in which a silicon oxide film or a silicon oxynitride film is formed as a gate insulating film over the gate electrode, an Al film or an Al alloy film is formed as a first conductive film, and a ZnO film to which an n-type or p-type impurity is added is formed as a second conductive film, and then, the second conductive film is etched to have an island-like shape by a first etching and the first conductive film is etched to have an island-like shape by a second etching to form source and drain electrodes, and a ZnO semiconductor film is formed.

Figure 2A:
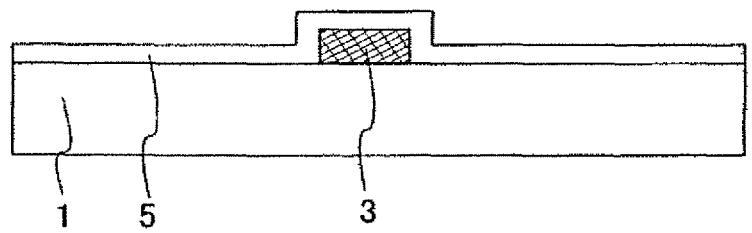
FIGS. 2A to 2D show manufacturing steps of a semiconductor device of this invention.

As shown in FIG. 2A, a gate electrode 3 is formed. The thickness of the gate electrode may be 10 to 200 nm over a substrate 1. The substrate 1 may be formed by using the material shown in Embodiment 1. Here, a glass substrate is used.

Figure 2B:
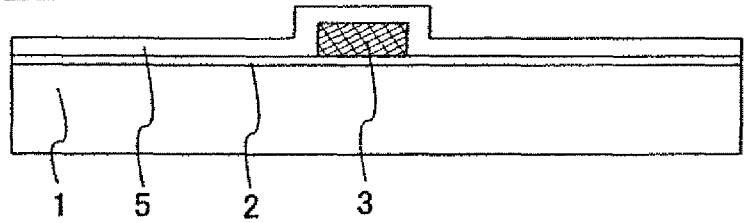

An insulating film 2 containing silicon oxide (SiOx), silicon nitride (SiNx), silicon oxynitride (SiOxNy) (x>y), silicon nitride oxide (SiNxOy) (x>y), or the like may be formed with a thickness of 10 to 200 nm by CVD or sputtering so as to prevent impurity or the like from diffusing from the substrate side (FIG. 2B).

The insulating film 2 may be formed by processing the surface of the substrate 1 with high density plasma. For example, the high density plasma can be generated using a microwave of 2.45 GHz, and it is only required that electron density ranges from $1\times10^{11}$ to $1\times10^{13}/cm^3$, and electron temperature is 2 eV or less. Such high density plasma has a low kinetic energy of active species and a film with fewer defects can be formed with less damage caused by plasma compared to a conventional plasma treatment.

The surface of the substrate 1 can be nitrided by the high density plasma treatment under a nitriding atmosphere such as an atmosphere containing nitrogen and a noble gas, an atmosphere containing nitrogen, hydrogen and a noble gas, and an atmosphere containing ammonia and a noble gas. In the case where a glass substrate is used as the substrate 1 subjected to a nitriding treatment by the high density plasma, as a nitride film formed over the surface of the substrate 1, the insulating film 2 containing silicon nitride as a main component can be formed. The insulating film 2 may be formed by using a plurality of layers in which a silicon oxide film or a silicon oxynitride film is formed by plasma CVD over the nitride film.

In addition, a nitride film can be formed by nitriding over the surface of the insulating film 2 with high density plasma similarly.

The nitride film formed by nitriding with high density plasma can suppress diffusion of impurity from the substrate 1.

The gate electrode 3 can be formed by using materials shown in Embodiment 1. Here, an AlNd (aluminum neodymium) film is formed by sputtering using an AlNd target and processed into an island-like shape. A photolithography method is used for processing the film into an island-like shape, and dry etching or wet etching is used.

After cleaning the surface of the gate electrode 3 and the surface of the substrate 1 or the insulating film 2, a gate insulating film 5 is formed with a thickness of 10 to 200 nm using a known CVD or sputtering over the gate electrode 3 (FIG. 2A and 2B). The surface cleaning step and the formation step of the gate insulating film 5 may be carried out continuously without being exposed to air. In the case where an Al film is used for the gate electrode 3, when the gate insulating film 5 is formed at a high temperature, a hillock is generated in some cases. Thus, it is preferable to form the film at a low temperature of 500° C. or less, preferably 350° C. or less.

The gate insulating film 5 can be formed by using the material shown in Embodiment 1. Here, a silicon oxide film is formed. Note that the insulating film 2 is omitted in the drawings below.

A first conductive film 6 for source and drain electrodes is formed with a thickness of 10 to 200 nm on the gate insulating film 5. The first conductive film 6 can be formed by using the material shown in Embodiment 1. Here, an AlNi (aluminum nickel) film or an AlNd film is used. The first conductive film 6 can be formed by sputtering using an AlNi target or an AlNd target. After forming the gate insulating film 5, the first conductive film 6 may be formed continuously without being exposed to the air.

Figure 2C:
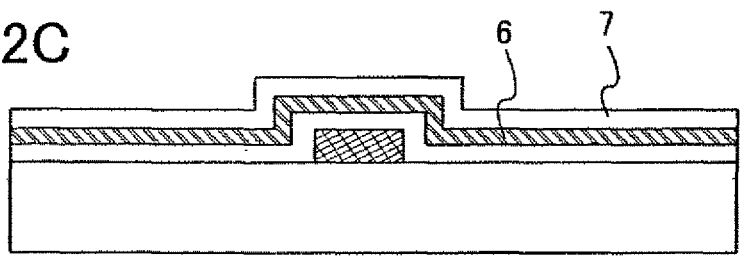

A second conductive film 7 is formed with a thickness of 10 to 200 nm on the first conductive film 6 (FIG. 2C). The second conductive film 7 can be formed by using the material shown in Embodiment 1. Here, ZnO (zinc oxide) to which an impurity such as Al or Ga is added is used. Consequently, an ohmic contact can be easily created between the second conductive film 7 and a ZnO film which is formed as a semiconductor layer later. The second conductive film 7 can be formed by sputtering. For example, the following methods can be used for adding Al or Ga: sputtering using a ZnO target to which 1 to 10 weight % of Al or Ga is added; or sputtering in which an Al or Ga chip is mounted on a ZnO target at 200 to 300°0 C.

After forming the first conductive film 6, the second conductive film 7 may be formed continuously without being exposed to the air. Therefore, formation from the gate insulating film 5 to the second conductive film 7 may be continuously carried out without being exposed to air.

Figure 2D:
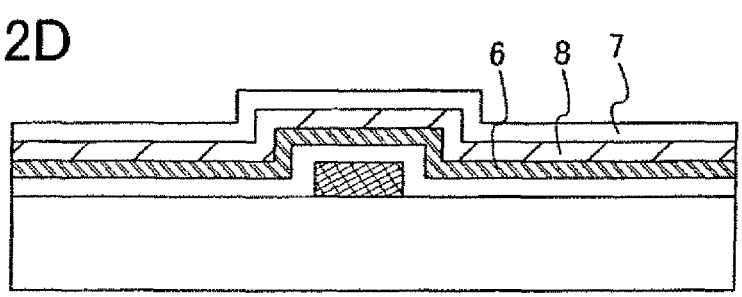

A third conductive film 8 may be formed with a thickness of 10 to 200 nm between the first conductive film 6 and the second conductive film 7 (FIG. 2D). A contact resistance is occasionally increased between the first conductive film 6 and the second conductive film 7 depending on a heat treatment temperature in a manufacturing process. However, the contact resistance can be reduced between the first conductive film 6 and the second conductive film 7 by forming the third conductive film 8. The third conductive film 8 can be formed by using a metal film such as a Ti film which is formed by sputtering or the like.

Figure 3A:
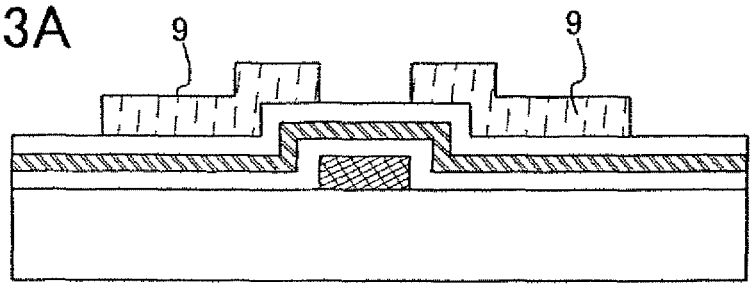
FIGS. 3A to 3D show manufacturing steps of a semiconductor device of this invention.
Figure 3B:
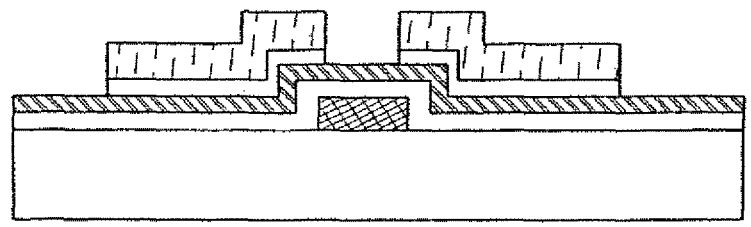

A resist mask 9 is formed over the second conductive film 7, and the second conductive film 7 is etched (FIGS. 3A and 3B). In the case of using wet etching, buffered fluoric acid (in which HF (hydrofluoric acid) and $NH_4F$ (ammonium fluoride) are mixed), for example, solution with a ratio of HF:$NH_4F$ (weight ratio)=1:100 to 1:10 is used.

In the case of using dry etching, anisotropic plasma etching using $CH_4$ gas can be used.

Under the second conductive film 7, the first conductive film 6 is formed. Thus, the first conductive film 6 serves as an etching stopper when the second conductive film 7 is etched. Consequently, source and drain electrodes can be formed without damaging the gate insulating film 5 in etching.

A part of the first conductive film 6 may be etched when the second conductive film 7 is etched. However, attention is required to be paid so as not to totally etch the first conductive film 6 because the gate insulating film is damaged if the first conductive film 6 is totally etched.

Figure 3C:
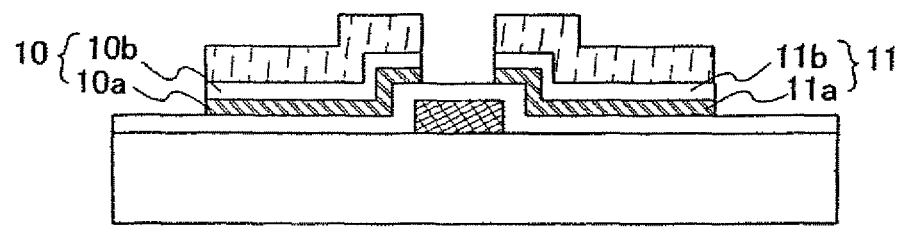

Next, a source electrode 10 and a drain electrode 11 are formed by etching the first conductive film 6 using the resist mask 9 (FIG. 3C). In this invention, the first conductive film 6 is etched using an organic alkaline solution represented by TMAH (tetramethylammonium hydroxide), which is a developer for a photoresist.

In the case of using an AlNi film for the first conductive film 6 and TMAH for etching solution, the etching ratio is approximately 300 nm/min at 30° C. On the other hand, the second conductive film 7 or the gate insulating film 5 to which the above-mentioned material is used is not etched with TMAH. Consequently, the source electrode 10 and the drain electrode 11 can be formed without damaging the gate insulating film 5. Further, the island-like shaped second conductive films 10b and 11b are not reduced in size. In this invention, the first conductive film 6 can be etched using a developer which is used when a resist mask is formed without using a special etching solution. Consequently, cost is reduced and efficiency is increased.

The resist mask 9 is removed after forming the source electrode 10 and the drain electrode 11.

Figure 3D:
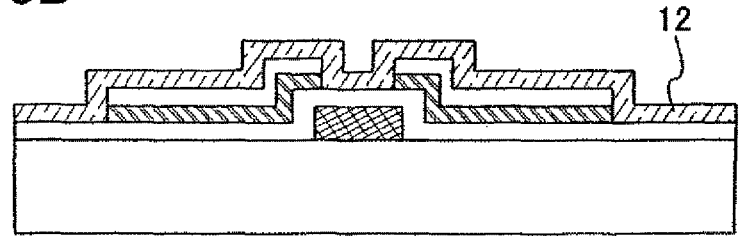

A ZnO film is formed as a semiconductor film 12 with a thickness of 20 to 200 nm by sputtering over the source electrode 10, the drain electrode 11, and the gate insulating film 5 (FIG. 3D). For example, the film can be formed by sputtering using a ZnO target with a flow ratio of oxygen/argon ranging from 30 to 20, at 200 to 300° C.

Figure 4A:
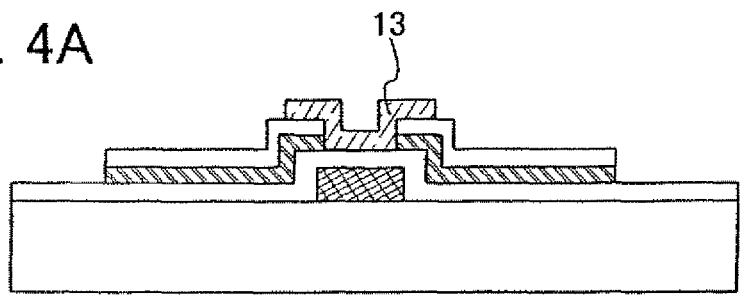
FIGS. 4A and 4B show manufacturing steps of a semiconductor device of this invention.

The semiconductor film 12 is etched by a photolithography method to form an island-like shaped semiconductor film 13 (FIG. 4A). A wet etching method using a buffered fluoric acid or anisotropic dry etching method using $CH_4$ gas can be used.

Zno is commonly used in the semiconductor film 12 and the second conductive films 10b and 11b, and it is difficult to obtain a sufficient etching selectivity. However, since the second conductive film 7 is required to be formed in a portion in contact with the semiconductor film 12, the second conductive film 7 may be etched in a portion out of contact with the semiconductor film 12, for example, a wire portion. In the above-mentioned etching method, the second conductive films 10b and 11b may be etched, but the first conductive films 10a and 11a are not etched. Consequently, the first conductive films 10a and 11a serve as wires, and the electrical connection with the semiconductor device is ensured.

Figure 4B:
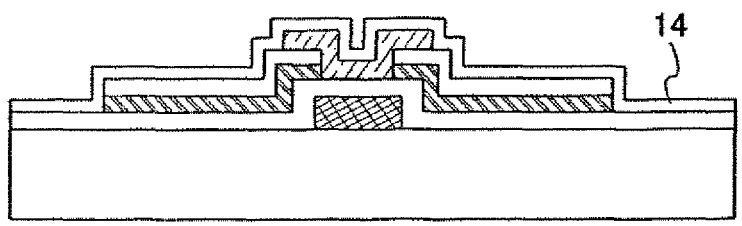

An insulating film 14 is formed with a thickness of 50 nm to 1 82 m over a semiconductor film 13 by CVD or sputtering (FIG. 4B). An insulating film containing silicon as a main component can be formed as the insulating film 14. An organic resin film or the like may be stacked over the insulating film containing silicon. The insulating film 14 functions as a planarization film or a passivation film. Since Al is included in the source electrode 10 and the drain electrode 11, a hillock is occasionally generated when the insulating film 14 is formed at high temperature. Thus, it is preferably formed at low temperature, 500° C. or less, preferably 350° C. or less.

Contact holes are formed in the insulating film 14, and conductive films in contact with the gate electrode 3, the source electrode 10, and the drain electrode 11 are provided if necessary.

According to this invention, a semiconductor device can be formed without damaging the gate insulating film. An Al alloy film such as an AlNi film is used as the first conductive film, thereby achieving lower resistance of the wire.

Embodiment 4

Here, a manufacturing method of a top gate semiconductor device is described, in which an Al film or an Al alloy film is formed as a first conductive film on a silicon oxide film or a silicon oxynitride film, and a ZnO film to which an n-type or p-type impurity is added is formed as a second conductive film, and then, the second conductive film is formed to have an island-like shape by a first etching, the first conductive film is formed to have an island-like shape by a second etching to form source and drain electrodes, a ZnO semiconductor film is formed, a gate insulating film is formed, and a gate electrode is formed. Note that it is needless to say that materials and methods for manufacture described in Embodiments 1 to 3 can be applied to those used for the present embodiment.

Figure 5A:
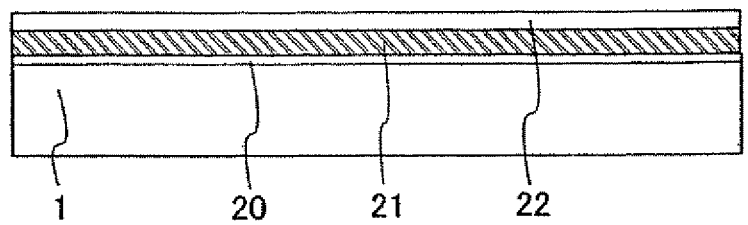
FIGS. 5A to 5D show manufacturing steps of a semiconductor device of this invention.

As shown in FIG. 5A, a silicon oxide (SiOx) film is formed as an insulating film 20 over a substrate 1 with a thickness of 10 to 200 nm by CVD or sputtering. The insulating film 20 prevents impurity or the like from diffusing from the substrate 1 side.

A first conductive film 21 for the source and drain electrodes is formed with a thickness of 10 to 200 nm by sputtering or evaporation over the insulating film 20. An Al alloy film such as AlNi (aluminum nickel) film which is shown in Embodiment 1 can be used as the first conductive film 21. After forming the insulating film 20, the first conductive film 21 may be formed continuously without being exposed to the air.

A second conductive film 22 is formed with a thickness of 10 to 200 nm by sputtering on the first conductive film 21 (FIG. 5A). As the second conductive film 22, ZnO (zinc oxide) to which a p-type or n-type impurity such as B (boron), Al (aluminum), Ga (gallium), P (phosphourus), or As (arsenic) is added can be used. After forming the first conductive film 21, the second conductive film 22 may be formed continuously without being exposed to the air. Therefore, the steps of forming the insulating film 20 to the second conductive film 22 may be carried out continuously without being exposed to the air.

Figure 5B:
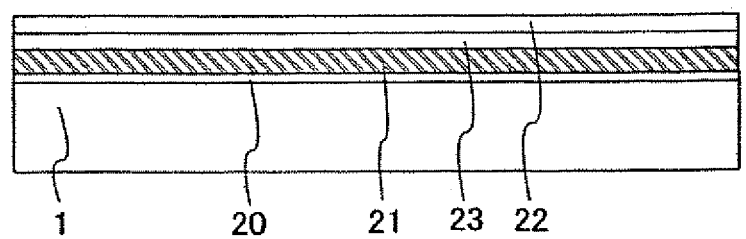

A metal film such as a Ti film may be formed as a third conductive film 23 with a thickness of 10 to 200 nm by sputtering between the first conductive film 21 and the second conductive film 22 in order to reduce the contact resistance between the first conductive film 21 and the second conductive film 22 (FIG. 5B).

Figure 5C:
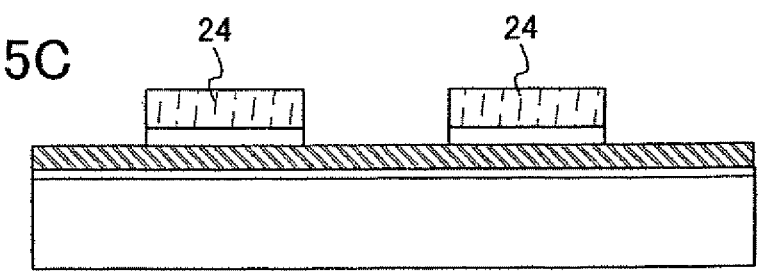

A resist mask 24 is formed over the second conductive film 22, and the second conductive film 22 is etched (FIG. 5C). Wet etching using buffered fluoric acid or dry etching using $CH_4$ gas can be used as an etching method.

The first conductive film 21 is formed under the second conductive film 22. Therefore, the first conductive film 21 serves as an etching stopper when the second conductive film 22 is etched. Thus, the source and drain electrodes can be formed without exposing the substrate 1 by etching the insulating film 20.

When the second conductive film 22 is etched, a part of the first conductive film 21 may be etched. Note that if all of the first conductive film 21 is etched, the insulating film 20 is etched and the substrate 1 is exposed, which would cause diffusion of impurity included in the substrate 1.

Figure 5D:
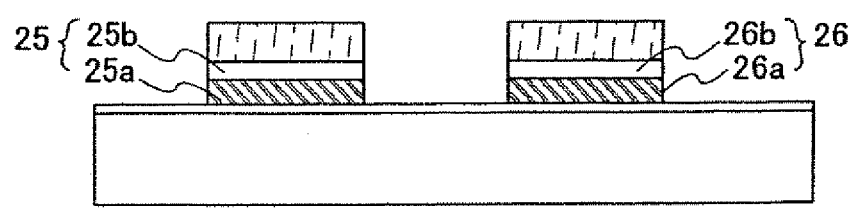

The first conductive film 21 is etched to form the source electrode 25 and the drain electrode 26 (FIG. 5D). Wet etching using a developer for a photoresist, TMAH is used as an etching method. Thus, the source electrode 25 and the drain electrode 26 can be formed without etching the insulating film 20. Further, the sizes of the island-like shaped second conductive films 25b and 26b are not reduced because the ZnO film is not etched by TMAH. Etching can be performed with a developer which is used in formation of a resist mask without a special etching solution for the first conductive film 21, which leads to cost reduction and improvement in efficiency.

After forming the source electrode 25 and the drain electrode 26, the resist mask 24 is removed.

Figure 6A:
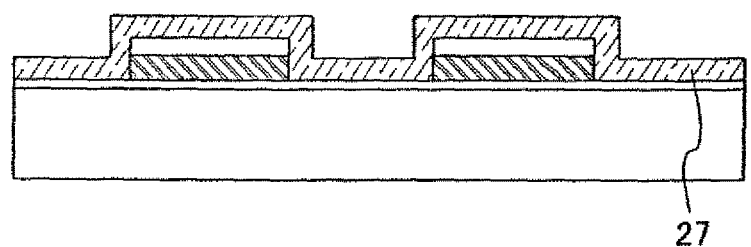
FIGS. 6A to 6C show manufacturing steps of a semiconductor device of this invention.

A ZnO film is formed with a thickness of 20 to 200 nm by sputtering as the semiconductor film 27 over the source electrode 25, the drain electrode 26, and the insulating film 20 (FIG. 6A).

The semiconductor film 27 is etched by a photolithography method to make an island-like shaped semiconductor film 27. Wet etching using buffered fluoric acid or dry etching using $CH_4$ gas can be used as an etching method.

ZnO is commonly used for the semiconductor film 27 and the second conductive films 25b and 26b, and it is difficult to obtain a high etching selectivity. However, the second conductive film may be etched in the portion out of contact with the semiconductor film 27, specially the wire portion, because the second conductive film 22 may be formed in the source and drain electrode portions, which is the same as Embodiment 3.

Figure 6B:
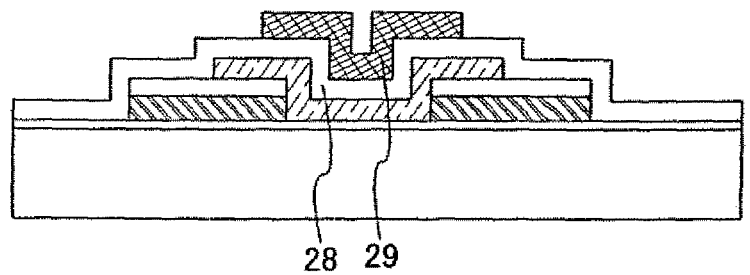

A gate insulating film 28 is formed with a thickness of 10 to 200 nm by CVD or sputtering over the semiconductor film 27 (FIG. 6B). The semiconductor film 27 may be subjected to a high density plasma treatment shown in the above-mentioned Embodiment to form a gate insulating film. The surface of the semiconductor film 27 can be nitrided by the high density plasma treatment under a nitriding atmosphere such as an atmosphere containing nitrogen and a noble gas; an atmosphere containing nitrogen, hydrogen, and a noble gas; and an atmosphere containing ammonia and a noble gas.

The gate insulating film 28 may be formed by using an insulating film containing silicon as a main component, for example, a silicon oxide film, a silicon oxynitride film, a silicon nitride film, and a silicon nitride oxide film. In addition, it may be a single layer or a layered film.

A gate electrode 29 is formed over the gate insulating film 28 (FIG. 6B). The gate electrode 29 can be formed by using the material shown in the above-mentioned embodiment, and may be a single layer or a layered film including two or more layers. A known CVD sputtering, evaporation, or the like can be employed as a method for film formation. Dry etching or wet etching method can be used for processing the gate electrode 29 into an island-like shape with a photolithography method.

Figure 6C:
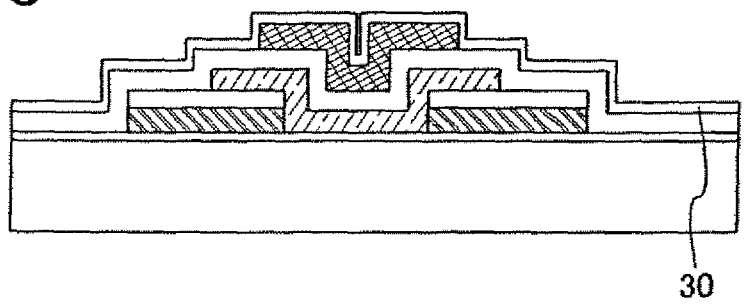
Figure 7A:
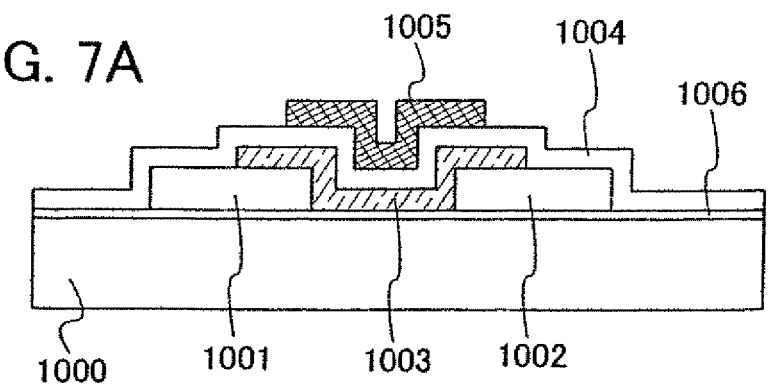
FIGS. 7A and 7B show conventional examples.
Figure 7B:
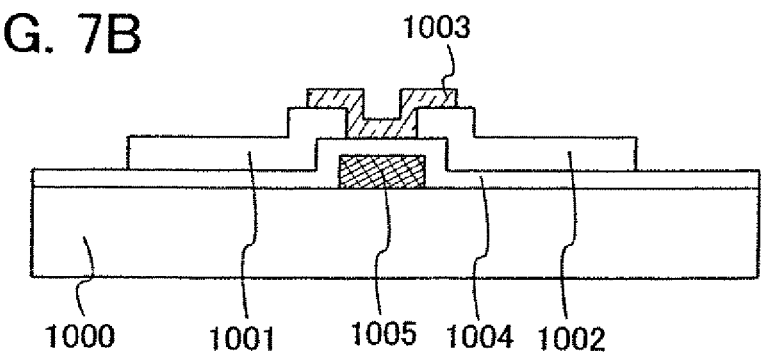

An insulating film 30 is formed with a thickness of 50 nm to 1 μm by CVD or sputtering over the gate electrode 29 and the gate insulating film 28 (FIG. 6C). The insulating film 30 can be formed by using an insulating film containing silicon. An organic resin film or the like may be stacked over the insulating film containing silicon. The insulating film 30 functions as a planarization film or a passivation film. Since Al is included in the source electrode 25 and the drain electrode 26, a hillock is occasionally generated when the gate insulating film 28, the gate electrode 29, and the insulating film 30 are formed at a high temperature. Thus, they are preferably formed at a low temperature, at 500° C. or less, preferably 350°0 C. or less.

As described above, this invention can prevent an impurity from diffusing due to an exposure of the substrate 1. An Al alloy film such as an AlNi film is used as the first conductive film, thereby achieving lower resistance of a wire.

Embodiment 5

Figure 8A:
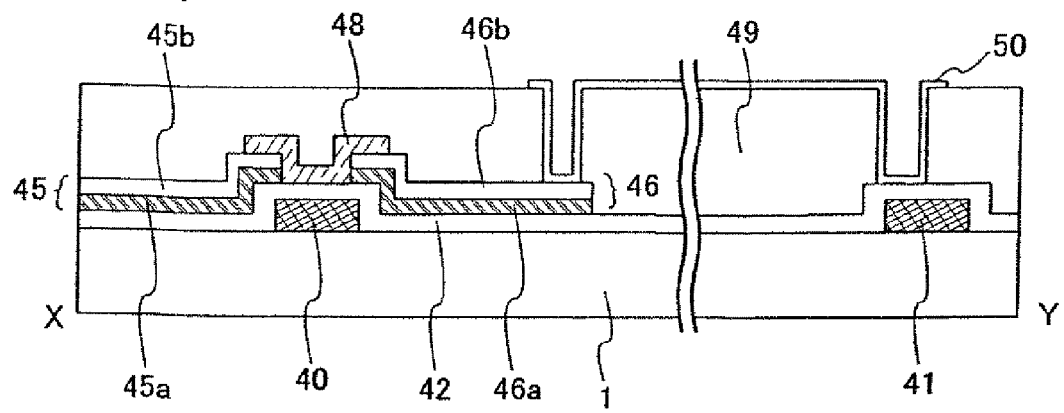
FIGS. 8A and 8B show a manufacturing step of a liquid crystal display device.
Figure 8B:
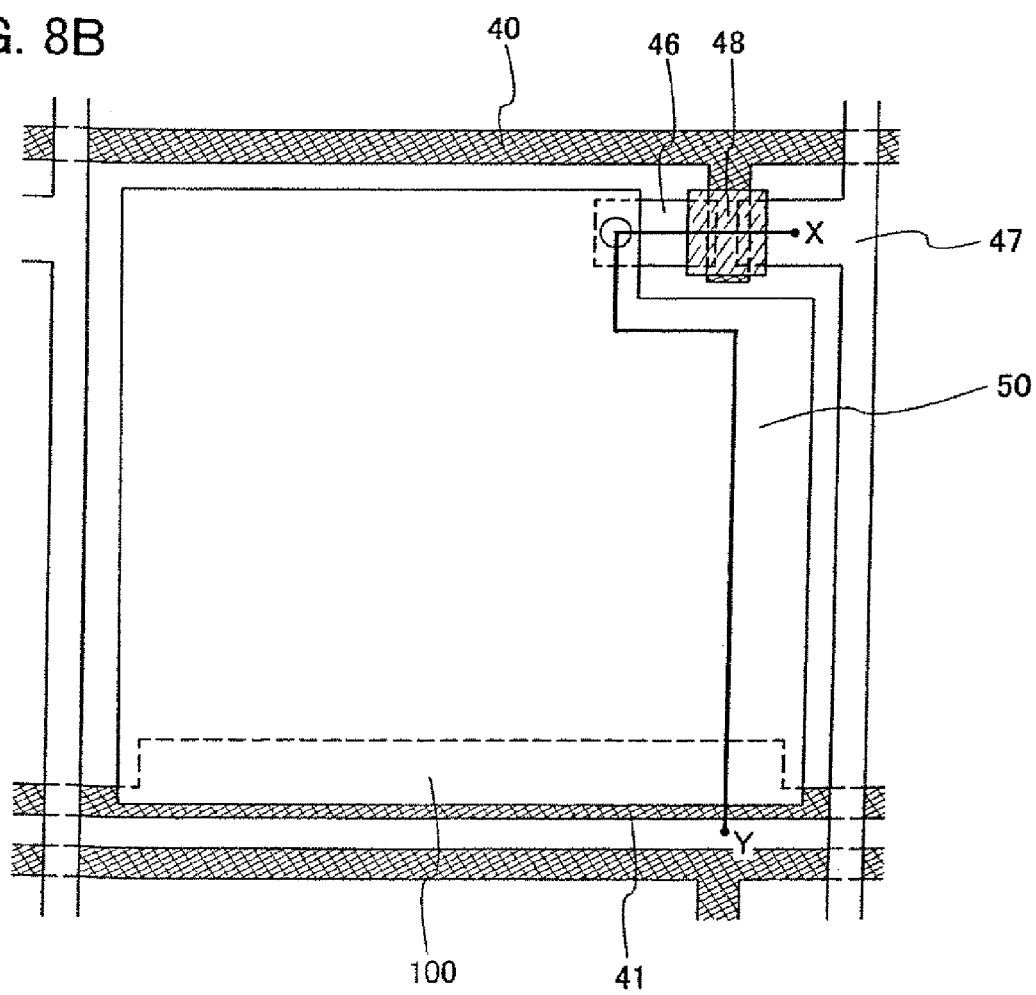
Figure 9A:
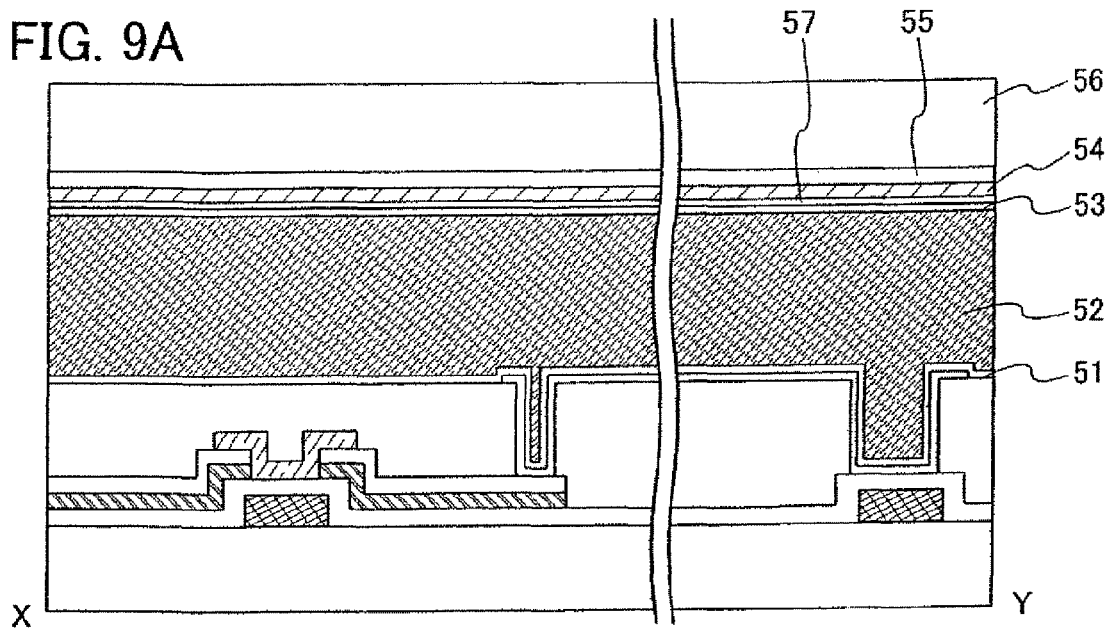
FIGS. 9A and 9B show manufacturing steps of a liquid crystal display device.

Here, a description is made of a method of manufacturing a liquid crystal display device using a bottom gate semiconductor device which is shown in Embodiments 1 and 3 referring to FIGS. 8A and 8B and 9A and 9B. Note that it is needless to say that the top gate semiconductor device which is shown in Embodiments 2 and 4 can be applied. FIGS. 8A and 9A show cross-sectional views taken along line X-Y in FIG. 8B.

A gate wire 40 and an auxiliary capacitor wire 41 are formed over a glass substrate or a plastic substrate 1. An AlNd film is formed by sputtering, and then, formed by known photolithography method and etching.

A gate insulating film 42 formed by using a silicon oxide film or a silicon oxynitride film is formed by CVD or sputtering.

An AlNi film is formed as a first conductive film by sputtering over the gate insulating film 42. The first conductive film forms a source electrode 45a, a drain electrode 46a and a source wire 47 later.

A ZnO (zinc oxide) film to which Al is added is formed as a second conductive film by sputtering over the first conductive film. The second conductive film forms a source electrode 45b, a drain electrode 46b, and a source wire 47 later.

A resist mask is formed in a region which is to be a source electrode portion, a drain electrode portion, and a source wire portion, over the second conductive film (not shown in the figure). Then, the second conductive film is etched. Here, etching is performed using buffered fluoric acid and a solution of $HF:NH_4F=1:100$ (weight ratio).

Next, the first conductive film is etched using TMAH solution to form the source electrode 45a, the drain electrode 46a, and the source wire 47. After that, the resist mask is removed. Then, the source electrode 45, the drain electrode 46, and the source wire 47 can be formed without damaging the gate insulating film 42. In addition, since the ZnO film is not etched by TMAH, the size of the island-like shaped second conductive film is not reduced. Further, since an AlNi film is used for the first conductive film, the resistance of the source wire can be reduced.

Next, a semiconductor film 48 is formed. A ZnO film is formed by sputtering, and then, the semiconductor film 48 is formed from the ZnO film by a photolithography method and etching. Wet etching using buffered fluoric acid is used as etching. The portion of the second conductive film out of contact with the semiconductor film 48 may be partially removed here, because the first conductive film is formed in a portion to be a wire.

An insulating film 49 is formed by CVD, sputtering, coating, or the like over the semiconductor film 48. The insulating film 49 can be formed by using a layered film having an insulating film containing silicon, an organic resin film, or the like. The insulating film 49 may be a film which makes the unevenness of the surface planarized.

A contact hole leading to the drain electrode 46 and a contact hole for the auxiliary capacitor are formed in the insulating film 49 using a photolithography method and an etching method.

A transparent conductive film is formed by sputtering, and then, a pixel electrode 50 is formed using a photolithography method and etching. For example, ITO (Indium Tin Oxide), ITSO (Indium Tin Oxide containing silicon oxide), or IZO (Indium Zinc Oxide) may be used.

In the case of a reflective liquid crystal display device, a light reflective metal material such as Ag (silver), Au (gold), Cu (copper), W (tungsten), or Al (aluminum) is formed instead of a transparent electrode.

The portion where the pixel electrode 50 and the auxiliary capacitor wire 41 are overlapped forms an auxiliary capacitor 100 which is formed of the pixel electrode 50, the gate insulating film 42, and the auxiliary capacitor wire 41 (FIGS. 8A and 8B).

A corner of a bent portion or a portion where width changes may be smoothed and rounded in a wire and an electrode. A shape of a chamfered corner can be realized by using a photomask pattern manufactured using a pattern of photomask. This will have advantages described below. When dry etching using plasma is performed, generation of fine particles due to abnormal discharge can be suppressed by chamfering a projecting portion. Even though the fine particles are generated, the fine particles can be prevented from accumulating at the corner at the time of cleaning, and the fine particles can be washed away by chamfering a concave portion. Thus, a problem of fine particles or dust in the manufacturing process can be solved and the yield can be improved.

An alignment film 51 is formed so as to cover the pixel electrode 50. The alignment film is formed by a droplet discharge method, printing, or the like. After forming the alignment film, rubbing is conducted.

A color filter 55 is formed by using a colored layer and a light-shielding layer (black matrix), and a protective insulating film 54 is formed on an opposing substrate 56. A transparent electrode 57 is formed, and an alignment film 53 is formed on the protective insulating film 54 (FIG. 9A). The alignment film is subjected to a rubbing process.

Figure 9B:
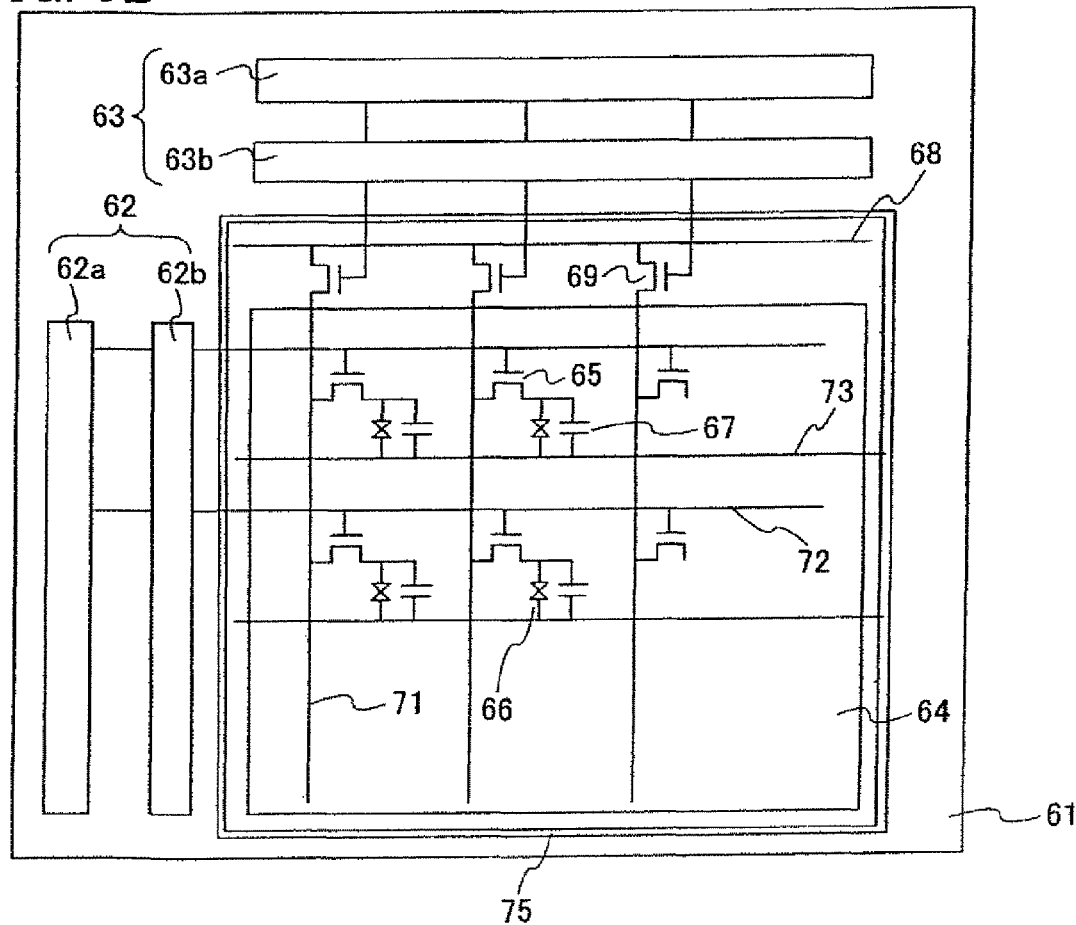

Next, a closed pattern 75 of a sealant is formed by a droplet discharge method (FIG. 9B). A region surrounded by the sealant is filled with liquid crystal composition 52 (FIG. 9A).

After dropping the liquid crystal composition 52 in the closed pattern 75, the opposing substrate 56 and a substrate 1 in which a semiconductor device is formed are attached to each other. When the liquid crystal composition 52 is filled, the following alternative may be adopted: a seal pattern having an opening portion is provided on the substrate 1; the opposing substrate 56 and the substrate 1 are attached to each other; then, liquid crystal is injected using capillary action.

As an alignment mode of the liquid crystal composition 52, TN mode in which the alignment of liquid crystal molecules is twisted at 90° from the side of light incidence to the side of light emission, FLC mode, IPS mode, or the like can be used. Note that an electrode pattern is different from one shown in FIG. 5B and is a comb-like shape in the case of the IPS mode.

Polarizing plates are attached to both of the opposing substrate 56 and the substrate 1 on which the semiconductor device is formed. In addition, an optical film can be attached if required.

The distance between the opposing substrate 56 and the substrate 1 on which the semiconductor device is formed may be kept by dispersing spherical spacers or forming a columnar spacer formed of a resin, or by mixing fillers in the sealant. The aforementioned columnar spacer is formed of an organic resin material containing at least one of acrylic, polyimide, polyimide amide, or epoxy as a main component, or an inorganic material having one of silicon oxide, silicon nitride and silicon oxide containing nitrogen, or a layered film thereof.

Then, an FPC (Flexible Printed Circuit) is attached to the the substrate 1 with an anisotropic conductive layer interposed therebetween using a known technique.

A peripheral driver circuit may be formed over the substrate. A plane exemplary diagram is shown in FIG. 9B.

A gate wire driver circuit 62, a source wire driver circuit 63, and an active matrix portion 64 are formed over a substrate 61 formed of glass or the like. The gate wire driver circuit 62 is constituted from at least a shift register 62a and a buffer 62b. The source wire driver circuit 63 is constituted from at least a shift register 63a, a buffer 63b, and an analog switch 69 which samples video signals transmitted via video lines 68. A plurality of gate wires 72 extended from the gate wire driver circuit 62 is arranged in parallel with each other in the active matrix portion 64. A plurality of source wires 71 extended from the source wire driver circuit 63 is arranged orthogonally to the gate wires 72. In addition, an auxiliary capacitor wire 73 is arranged in parallel with the gate wires 72. In addition, a semiconductor device 65, a liquid crystal portion 66, and an auxiliary capacitor 67 are provided in a region surrounded by the gate wire 72, the source wires 71, and the auxiliary capacitor wire 73.

The gate wire driver circuit 62, the source wire driver circuit 63, and the analog switch 69 are provided with a semiconductor device manufactured by the same manufacturing method as the semiconductor device 65 to have a similar structure.

In the semiconductor device 65, a gate electrode is connected to the gate wire 72, and the source electrode is connected to the source wire 71. A liquid crystal portion 66 is formed by introducing a liquid crystal to be sealed between a pixel electrode connected to the drain electrode of the semiconductor device 65 and an opposing electrode over the opposing substrate. The auxiliary capacitor wire 73 is connected to an electrode having the same potential as the opposing electrode.

In the aforementioned liquid crystal display device, the gate insulating film is not etched and the characteristics do not become unstable, and thus, high reliability is realized. In the case of using a top gate semiconductor device, a glass substrate or a base film formed by using, a silicon oxide film or a silicon oxynitride film is not etched, so that impurity such as sodium is not diffused into a semiconductor film from the substrate and the characteristics are not deteriorated, and thus, high reliability can be realized.

Al is used for a part of the source electrode and the drain electrode, thereby achieving lower resistance of a wire.

Embodiment 6

Here, a description is made of a method for manufacturing a light-emitting device with using the bottom gate semiconductor device shown in Embodiments 1 and 3 referring to FIGS. 10A and 10B and 11A and 11B. Note that it is needless to say that the semiconductor device of Embodiments 2 and 4 can be applied.

Figure 10A:
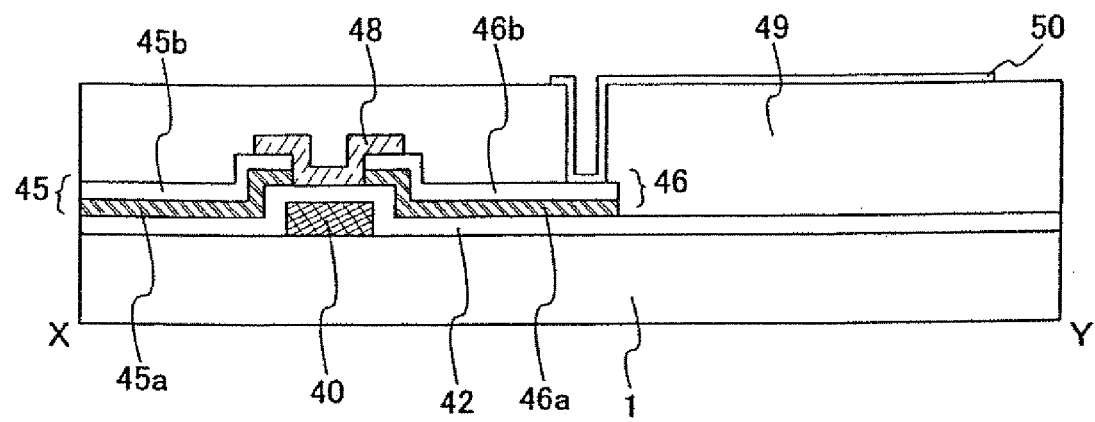
FIGS. 10A and 10B show manufacturing steps of a light-emitting device.

The semiconductor device is manufactured based on the description of the aforementioned embodiment, and formation to the stage shown in FIG. 10A is carried out. Note that the same parts as those of the above embodiments are denoted by the same reference numerals.

In the EL display device, the pixel electrode 50 functions as an anode or a cathode. As the material for the pixel electrode 50, the following can be employed: a conductive metal such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), caesium (Cs), magnesium (Mg), calcium (Ca), strontium (Sr), or titanium (Ti); an alloy such as aluminum-silicon (Al—Si), aluminum-titanium (Al—Ti), or aluminum-silicon-copper (Al—Si—Cu); nitride of a metal material such as titanium nitride (TiN); a metal compound such as ITO, ITO containing silicon, or IZO.

An electrode from which light emitted from an EL layer is extracted is only required to be formed by using a light-transmitting conductive film, and a very thin film of metal such as Al or Ag may be used as well as a metal compound such as ITO, ITO containing silicon, or IZO.

When light-emission is extracted from an electrode which is opposed to the pixel electrode 50, a highly reflective material (Al, Ag, or the like) can be used for the pixel electrode 50. In this embodiment, ITSO, which means ITO containing silicon, is used as the pixel electrode 50 (FIG. 10A).

Figure 10B:
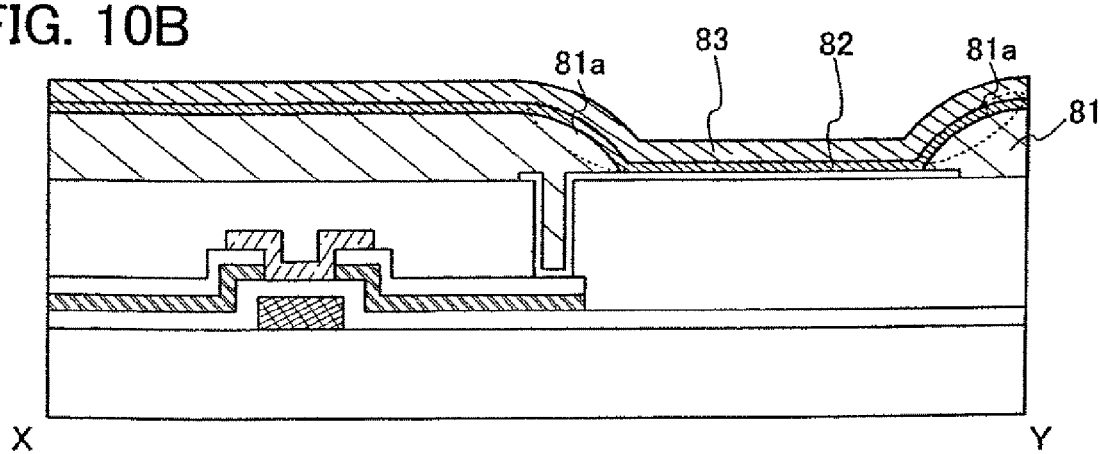

Next, an insulating film formed by using an organic material or an inorganic material is formed so as to cover the insulating film 49 and the pixel electrode 50. Then, the insulating film is processed to expose the pixel electrode 50 partially, thereby forming partition walls 81. As the material of the partition walls 81, a photosensitive organic material (such as acrylic or polyimide) is preferable. Alternatively, a non-photosensitive organic material or inorganic material may also be used. Further, the partition walls 81 may be used as a black matrix by coloring the partition walls 81 black in such a way that a black pigment or dye such as titanium black or carbon nitride is dispersed into the material of the partition wall 81 with the use of a dispersant. It is desirable that the partitions wall 81 have a tapered shape and those end surfaces 81a toward the pixel electrode have curvatures changing continuously (FIG. 10B).

Next, a layer 82 including a light-emitting substance is formed, and an opposing electrode 83 which covers the layer 82 including a light-emitting substance is formed. Then, a light-emitting element with the layer 82 including a light-emitting substance interposed between the pixel electrode 50 and the opposing electrode 83 can be manufactured, and light-emission can be obtained by applying a voltage between the opposing electrode 83 and the pixel electrode 50.

As an electrode material used for forming the opposing electrode 83, a material similar to one which can be used for the pixel electrode can be used. In this embodiment, aluminum is used for a second electrode.

The layer 82 including a light-emitting substance is formed by evaporation, ink-jet, spin coating, dip coating, roll-to-roll method, sputtering, or the like.

In the case of an organic electroluminescent display device, the layer 82 including a light-emitting substance may be a layered film of layers having functions of hole transportation, hole injection, electron transportation, electron injection, or light-emission, respectively, or a single layer of a light-emitting layer. As a layer including a light-emitting substance, a single layer or a layered film of an organic compound may be used.

A hole injecting layer is provided between an anode and a hole transporting layer. As the hole injecting layer, a mixed layer of an organic compound and a metal oxide can be used. This prevents short circuit between the pixel electrode 50 and the opposing electrode 83 due to unevenness which is formed on the surface of the pixel electrode 50 or a foreign substance which is left on the surface of the electrode. The thickness of the mixed layer is preferably 60 nm or more, more preferably 120 nm or more. Since increase in thickness of a film does not cause increase in driving voltage, the thickness of the film can be selected such that the influence of the unevenness or foreign substance can be covered sufficiently. Thus, a dark spot is not generated, and driving voltage or power consumption is not increased in the light-emitting device manufactured by this invention.

An oxide or a nitride of transition metal is preferable as a metal oxide, concretely, zirconium oxide, hafnium oxide, vanadium oxide, niobium oxide, tantalum oxide, chromium oxide, molybdenum oxide, tungsten oxide, titanium oxide, manganese oxide, and rhenium oxide.

As an organic compound, the following can be employed: an organic material having an arylamino group such as 4,4'-bis[N-(1-napthyl)-N-phenylamino]biphenyl (NPB), 4,4'-bis[N-(3-methylphenyl)-N-phenylamino]biphenyl (TPD), 4,4',4''-tris(N,N-diphenylamino)triphenylamine (TDATA), 4,4',4''-tris[N-(3-methylphenyl)-N-phenylamino]tripheny-lamine (MTDATA), 4,4'-bis{N-[4-(N,N-di-m-tolylamino) phenyl]-N-phenylamino}biphenyl (DNTPD), 1,3,5-tris[N, N-di(m-tolyl)amino] benzene (m-MTDAB), and 4,4',4''-tris (N-carbazolyl) triphenylamine (TCTA); phthalocyanine ($H_2Pc$); copper phthalocyanine (CuPc); vanadyl phthalocyanine (VOPc); or the like.

The hole transporting layer is provided between the anode and a light-emitting layer, or between the hole injecting layer and the light-emitting layer when the hole injecting layer is provided. The hole transporting layer is formed by using a layer which has an excellent property of transporting a hole, for example, a layer formed by using a compound of aromatic amine (that is, having a benzene ring-nitrogen bond) such as NPB, TPD, TDATA, MTDATA, and BSPB. The substances mentioned here have the hole mobility of $1 \times 10^{-6}$ to $10 \, cm^2 Vs$ mainly. Note that a substance having higher transporting property of holes than electrons may be used as well as the materials. Note that the hole transporting layer may be formed by not only a single layer but also a layered film in which two or more layers formed from the above mentioned substances are stacked.

The light-emitting layer is provided between the anode and the cathode, or between the hole transporting layer and the electron transporting layer when the hole transporting layer and the electron transporting layer are provided. There is no particular limitation on the light-emitting layer; however, a layer serving as the light-emitting layer has two modes roughly. One is a host-guest type layer which includes a dispersed light-emitting substance in a layer formed of a material (host material) having a larger energy gap than an energy gap of a light-emitting substance (dopant material) which becomes a luminescent center, while the other is a layer in which a light-emitting layer is made of a light-emitting substance only. The former is preferable, because concentration quenching hardly occurs. As the light-emitting substance to be a luminescent center, the following can be employed: 4-dicyanomethylene-2-methyl-6-(1,1,7,7-tetramethylju-lolidyl-9-enyl)-4H-pyran (DCJT); 4-dicyanomethylene-2-t-butyl-6-(1,1,7,7-tetramethyljulolidine-9-enyl)-4H-pyran; periflanthene; 2,5-dicyano-1,4-bis(10-methoxy-1,1,7,7-tet-ramethyljulolidine-9-enyl)benzene; N,N'-dimethylquinacri-done (DMQd); coumarin 6; coumarin 545T; tris (8-quinoli-nolato)aluminum ($Alq_3$); 9,9'-bianthryl; 9,10-diphenylanthracene (DPA); 9,10-bis(2-naphthyl)anthracene (DNA); 2,5,8,11-tetra-t-butylperylene (TBP); PtOEP; $Ir(ppy)_3$; $Btp_2Ir(acac)$; FIrpic; or the like. As the base material to be a host material in the case of forming the layer in which the light-emitting substance is diffused, the following can be used: an anthracene derivative such as 9,10-di(2-naphtyl)-2-tert-butylanthracene (t-BuDNA); a carbazole derivative such as 4,4'-bis(N-carbazolyl)biphenyl (CBP); or a metal complex such as tris(8-quinolinolato)aluminum ($Alq_3$), tris(4-methyl-8-quinolinolato)aluminum ($Almq_3$); bis(10-hydroxybenzo [h]-quinolinato)beryllium ($BeBq_2$); bis(2-methyl-8-quinoli-nolato)-4-phenylphenolato-aluminum (BAlq); bis[2-(2-hydroxyphenyl)pyridinato]zinc ($Znpp_2$); or bis[2-(2-hydroxyphenyl)benzoxazolate]zinc (ZnBOX). As the material which can constitute the light-emitting layer only with a light-emitting substance, tris(8-quinolinolato)aluminum (Alq$_3$), 9,10-bis(2-naphtyl)anthracene (DNA), bis(2-methyl-8-quinolinolato)-4-phenylphenolato-aluminum (BAlq), or the like can be used.

An electron transporting layer is provided between the light-emitting layer and the cathode, or between the light-emitting layer and an electron injecting layer when the electron injecting layer is provided. The electron transporting layer is a layer having an excellent electron transporting property, and for example, a layer formed using a metal complex having a quinoline skeleton or a benzoquinoline skeleton such as tris(8-quinolinolato)aluminum (Alq$_3$), tris(5-methyl-8-quinolinolato)aluminum (Almq$_3$), bis(10-hydroxybenzo[h]-quinolinato)beryllium (BeBq$_2$), and bis(2-methyl-8-quinolinolato)-4-phenylphenolato-aluminum (BAlq). In addition, a metal complex having an oxazole ligand or a thiazole ligand such as bis[2-(2-hydroxyphenyl)-benzoxazolato]zinc (Zn(BOX)$_2$), bis[2-(2-hydroxyphenyl)-benzothiazolato]zinc (Zn(BTZ)$_2$), or the like can be used. In addition to the metal complexes, 2-(4-biphenylyl)-5-(4-tert-butylphenyl)-1,3,4-oxadiazole (PBD); 1,3-bis[5-(p-tert-butylphenyl)-1,3,4-oxadiazole-2-yl]benzene (OXD-7); 3-(4-tert-butylphenyl)-4-phenyl-5-(4-biphenylyl)-1,2,4-triazole (TAZ); 3-(4-tert-butylphenyl)-4-(4-etbylphenyl)-5-(4-biphenylyl)-1,2,4-triazole (p-EtTAZ); bathophenanthroline (BPhen); bathocuproine (BCP); or the like can be used. These substances mentioned here mainly have the electron mobility of $1 \times 10^{-6}$ to 10 cm$^2$/Vs. Note that other substance may be used for the electron transporting layer so long as it has a higher electron transporting property than a hole transporting property. Further, the electron transporting layer may be formed by not only a single layer but also a layered film in which two or more layers made from the above mentioned substances are stacked.

The electron injecting layer is provided between the cathode and the electron transporting layer As the electron injecting layer, a compound of alkali metal or alkaline earth metal such as lithium fluoride (LiF), cesium fluoride (CsF), or calcium fluoride (Ca F$_2$) can be employed. In addition to that, a layer formed by using an electron transporting substance which contains alkali metal or alkaline earth metal, for example, Alq$_3$ containing magnesium (Mg) or the like can be used.

In the case of an inorganic electroluminescent display device, one in which a fluorescent substance particles are diffused in dispersing agent for the layer 82 including a light-emitting substance can be used.

A fluorescent substance in which a donor impurity such as Cl (chlorine), I (iodine), or Al (aluminum) is added with Cu (copper) in ZnS can be used.

As the dispersing agent, the following can be employed: a polymer having a relatively high dielectric constant such as cyanoethyl cellulose based resin, polyethylene based resin, polypropylene based resin, polystyrene based resin, silicone resin, epoxy resin, vinylidene fluoride resin, or the like. The dielectric constant can be adjusted by mixing the resin and minute particles having high dielectric constant such as BaTiO$_3$ (barium titanate) or SrTiO$_3$ (strontium titanate). As a diffusing means, an ultrasonic diffusing machine or the like can be used.

A dielectric layer may be provided between the layer 82 including a light-emitting substance and one of the electrodes. For the dielectric layer, a highly dielectric and insulating material which has a high dielectric breakdown voltage is employed. One is selected from a metal oxide or nitride, for example, TiO$_2$, BaTiO$_3$, SrTiO$_3$, PbTiO$_3$, KNbO$_3$, PbNbO$_3$, Ta$_2$O$_3$, BaTa$_2$O$_6$, LiTaO$_3$, Y$_2$O$_3$, Al$_2$O$_3$, ZrO$_2$, AlON, ZnS, or the like. Those may be disposed as a uniform film or a film having a particle structure.

In the case of an inorganic electroluminescent display device, a double-insulating structure in which a light-emitting layer is interposed between insulating layers may be employed. The light-emitting layer can be formed by using a II-VI compound such as Mn (manganese) or ZnO (zinc sulfide) containing a rare earth element, and the insulating layer can be formed by using oxide or nitride such as Si$_3$N$_4$, SiO$_2$, Al$_2$O$_3$, or TiO$_2$.

A silicon oxide film containing nitrogen is formed as a passivation film over the opposing electrode 83 by plasma CVD (not shown). In the case of using a silicon oxide film containing nitrogen, the following can be used: a silicon oxynitride film formed by using SiH$_4$, N$_2$O, and NH$_3$ by plasma CVD; a silicon oxynitride film formed by using SiH$_4$, and N$_2$O; or a silicon oxynitride film formed by using a gas in which SiH$_4$ and N$_2$O is diluted with Ar.

A silicon oxide nitride hydride film manufactured from SiH$_4$, N$_2$O, and H$_2$ may be employed as a passivation film. Note that a passivation film is not limited to the aforementioned substance. Another insulating film containing silicon as a main component can be also used. In addition, a layered film structure may be employed as well as a single layer structure. Further, a multilayer film of a carbon nitride film and a silicon nitride film or a multilayer film of a styrene polymer can be used. A silicon nitride film or a diamond-like carbon film may be formed.

Then, a display portion is sealed to protect a light-emitting element from a material such as water which promotes deterioration. In the case of using an opposing substrate for sealing, the opposing substrate is attached by using an insulating sealant so as to expose an external connection portion. A space between the opposing substrate and an element substrate may be filled with an inert gas such as dry nitrogen, or the opposing substrate may be attached by applying a sealant to the pixel portion entirely. It is preferable to use an ultraviolet curing resin or the like as the sealant. A drying agent or particles for keeping the gap between the substrates constant may be mixed in the sealant. Then, the light-emitting device is completed by attaching a flexible wire board to the external connection portion.

One example of a structure of the light-emitting device manufactured as described above is shown referring to FIGS. 11A and 11B. Note that portions having the same functions are sometimes denoted by the same reference numerals even though they have different shapes, and the explanations are occasionally omitted.

Figure 11A:
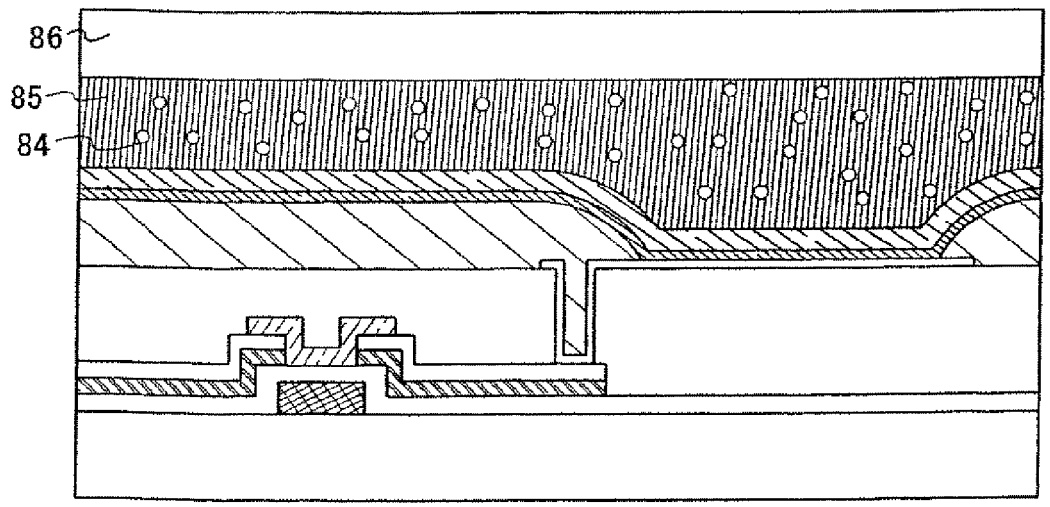
FIGS. 11A and 11B show manufacturing steps of a light-emitting device.

FIG. 11A shows a structure in which the pixel electrode 50 is formed using a light transmitting conductive film, and light generated in the layer 82 including a light-emitting substance is emitted toward a substrate 1. Further, reference numeral 86 denotes an opposing substrate. This opposing substrate is firmly attached to the substrate 1 using a sealant or the like after forming a light emitting element. A space between the opposing substrate 86 and the element is filled with resin 85 having a light-transmitting property or the like to seal the light emitting element. Accordingly, the light emitting element can be prevented from being deteriorated by moisture or the like. Preferably, the resin 85 has a hygroscopic property. More preferably, a drying agent 84 with a high light-transmitting property is dispersed in the resin 85 to prevent the adverse influence of moisture.

Figure 11B:
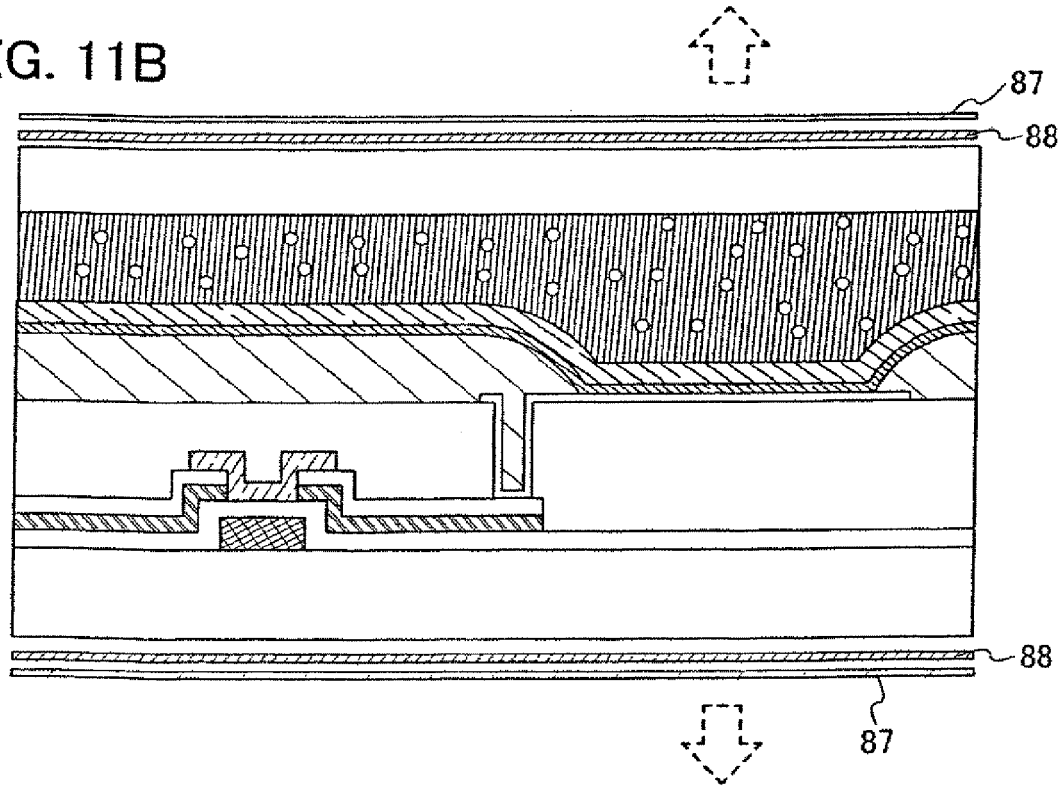

FIG. 11B shows a structure in which both the pixel electrode 50 and an opposing substrate 83 are formed by using conductive films having light-transmitting property. Accordingly, light can be emitted toward both the substrate 1 and the opposing substrate 86 as shown by an arrow of dotted lines. In this structure, by providing polarizing plates 88 outside of the substrate 1 and the opposing substrate 86, a screen can be prevented from being transparent, thereby improving visibility. Protection films 87 are preferably provided outside of the polarizing plates 88.

The light-emitting device of this invention having a display function may employ either an analog video signal or a digital video signal. If a digital video signal is used, the video signal may use either a voltage or a current.

When the light-emitting element emits light, a video signal to be inputted to a pixel may have either a constant voltage or a constant current. When a video signal has a constant voltage, a constant voltage is applied to a light-emitting element or a constant current flows through the light-emitting element.

Also, when a video signal has a constant current, a constant voltage is applied to a light-emitting element or a constant current flows through the light-emitting element. A driving method where a constant voltage is applied to a light-emitting element is called a constant voltage drive. Meanwhile, a driving method where a constant current flows through a light-emitting element is called a constant current drive. In the constant current drive, constant current flows regardless of change in resistance of a light emitting clement. The light emitting display device according to this invention and the driving method thereof may use any one of the aforementioned methods.

In the light-emitting device, a gate insulating film is not etched, and the characteristics of the light-emitting element is not unstable so that its reliability is high. In the case of using a top gate semiconductor device, since a glass substrate or a base film formed by using, a silicon oxide film or a silicon oxynitride film is not etched, impurity such as sodium which deteriorates characteristics is not diffused from the substrate into the semiconductor film so that high reliability is obtained.

Al is used for a part of the source electrode and the drain electrode, thereby achieving lower resistance of a wire.

A pixel circuit and a protective circuit included in a panel and module, and operation thereof are shown referring to FIGS. 12A to 12F and 13 or the like. FIGS. 10A and 10B and 11A and 11B each show a cross-sectional view of a driving TFT 1403 of the semiconductor device. A switching TFT 1401, a current control TFT 1404, and an eraser TFT 1406 may be manufactured at the same time of the driving TFT 1403, and may have the same structure as the driving TFT 1403.

Figure 12A:
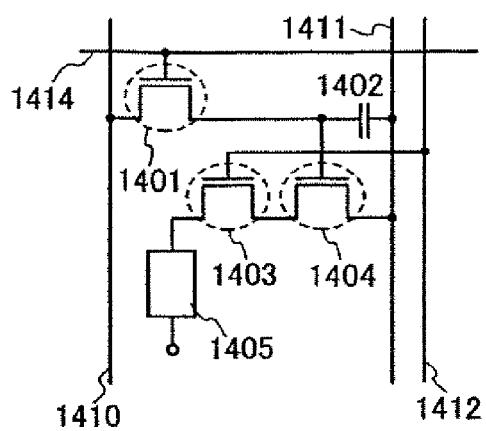
FIGS. 12A to 12F each show an equivalent circuit of a light-emitting device.

A pixel shown in FIG. 12A includes a signal line 1410 and power source lines 1411 and 1412 arranged in a column direction and a scan line 1414 arranged in a row direction. The pixel further includes a switching TFT 1401, the driving TFT 1403, the current control TFT 1404, an auxiliary capacitor 1402, and a light-emitting element 1405.

Figure 12B:
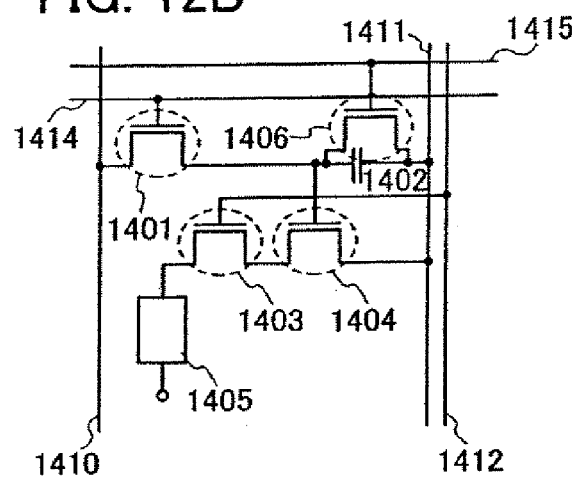
Figure 12C:
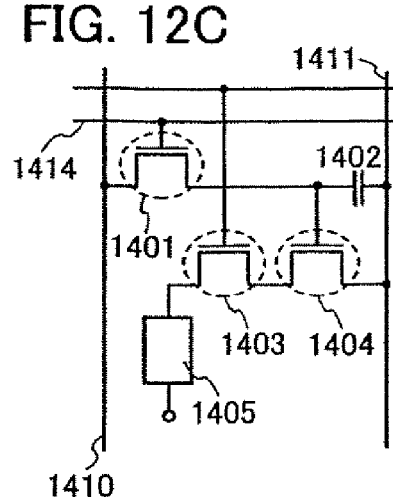
Figure 12D:
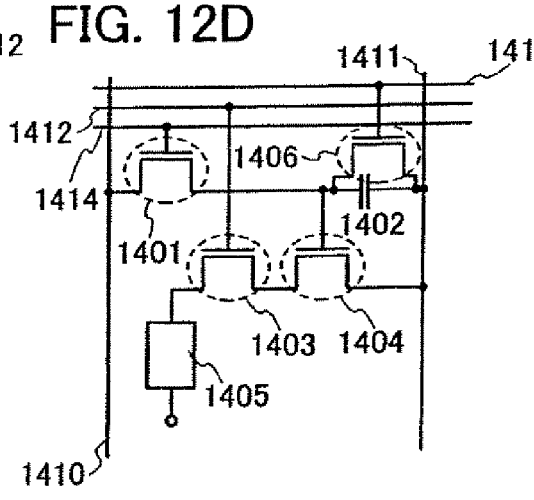

A pixel shown in FIG. 12C has the same structure as one in FIG. 12A except for that the gate electrode of the driving TFT 1403 is connected to the power source line 1412 provided in the row direction. In other words, the pixels shown in FIGS. 12A and 12C have the same equivalent circuit diagram. However, a power source line formed in the case of arranging the power source line 1412 in the column direction (FIG. 12A) is formed by using a conductive layer in a different layer from a layer in which a power source line is formed by using a conductive layer in the case of arranging the power source line 1412 in the row direction (FIG. 12C). Here, attention is paid to a wire connected to the gate electrode of the driving TFT 1403, and the structure is shown separately in FIGS. 12A and 12C in order to show that these wires are manufactured with different layers.

As a feature of the pixels shown in FIGS. 12A and 12C, the driving TFT 1403 and the current control TFT 1404 are connected serially within the pixel, and it is preferable to set the channel length L (1403) and the channel width W (1403) of the driving TFT 1403, and the channel length L (1404) and the channel width W (1404) of the current control TFT 1404 so as to satisfy L (1403)/W (1403):L (1404)/W (1404)=5 to 6000:1.

The driving TFT 1403 operates in a saturation region and serves to control the current value of the current flowing into the light-emitting element 1405. The current control TFT 1404 operates in a linear region and serves to control the current supplied to the light-emitting element 1405. Both the TFTs preferably have the same conductivity type in the manufacturing process, and the TFTs are n-channel type TFTs in this embodiment. The driving TFT 1403 may be either an enhancement mode TFT or a depletion mode TFT. Since the current control TFT 1404 operates in the linear region in the light-emitting device having the above structure, slight fluctuation of Vgs of the current control TFT 1404 does not affect the current value of the light-emitting element 1405. That is to say, the current value of the light-emitting element 1405 can be determined by the driving TFT 1403 operating in the saturation region. With the above structure, the variation of the luminance of the light-emitting element due to the variation of the characteristics of the TFT can be remedied, thereby providing a light-emitting device having improved image quality.

In each pixel shown in FIGS. 12A to 12D, the switching TFT 1401 is to control the input of the video signal to the pixel, and the video signal is inputted into the pixel when the switching TFT 1401 is turned on. Then, the voltage of the video signal is held in the auxiliary capacitor 1402. Although FIGS. 12A and 12C show the structure in which the auxiliary capacitor 1402 is provided, this invention is not limited thereto. When the gate capacitance and the like can serve as a capacitor holding the video signal, the auxiliary capacitor 1402 is not necessarily provided.

A pixel shown in FIG. 12B has the same pixel structure as that in FIG. 12A except for that a TFT 1406 and a scan line 1415 are added. In the same way, a pixel shown in FIG. 12D has the same pixel structure as that in FIG. 12C expect for that the TFT 1406 and the scan line 1415 are added.

ON and OFF of the TFT 1406 is controlled by the additionally provided scan line 1415. When the TFT 1406 is turned on, the charge held in the auxiliary capacitor 1402 is discharged, thereby turning off the current control TFT 1404. In other words, by the provision of the TFT 1406, a state can be produced compellingly in which the current does not flow into the light-emitting clement 1405. For this reason, the TFT 1406 can be referred to as an eraser TFT. Consequently, in the structures shown in FIGS. 12B and 12D, a lighting period can be started at the same time as or just after the start of a writing period before the writing of the signal into all the pixels; therefore the duty ratio can be increased.

In a pixel shown in FIC 12E, the signal line 1410 and the power source line 1411 are arranged in the column direction, and the scan line 1414 is arranged in the row direction. Further, the pixel includes the switching TFT 1401, the driving TFT 1403, the auxiliary capacitor 1402, and the light-emitting element 1405. A pixel shown in FIG. 12F has the same pixel structure as that shown in FIG. 12E except for that the TFT 1406 and the scan line 1415 are added. In the structure shown in FIG. 12F, the duty ratio can also be increased by the provision of the TFT 1406.

Such an active matrix light-emitting device can be driven at low voltage when the pixel density increases, because the TFTs are provided in respective pixels. Therefore, it is considered that the active matrix light-emitting device is advantageous.

Although this embodiment described the active matrix light-emitting device in which the respective TFTs are provided in respective pixels, a passive matrix light-emitting device can also be formed. Since the TFTs are not provided in respective pixels in the passive matrix light-emitting device, high aperture ratio can be obtained. In the case of a light-emitting device in which light is emitted to both sides of the light emission stack, the transmissivity of the passive matrix light-emitting device is increased.

Subsequently, a case will be described in which a diode is provided as a protective circuit on the scan line and the signal line with the use of an equivalent circuit shown in FIG. 12E.

Figure 13:
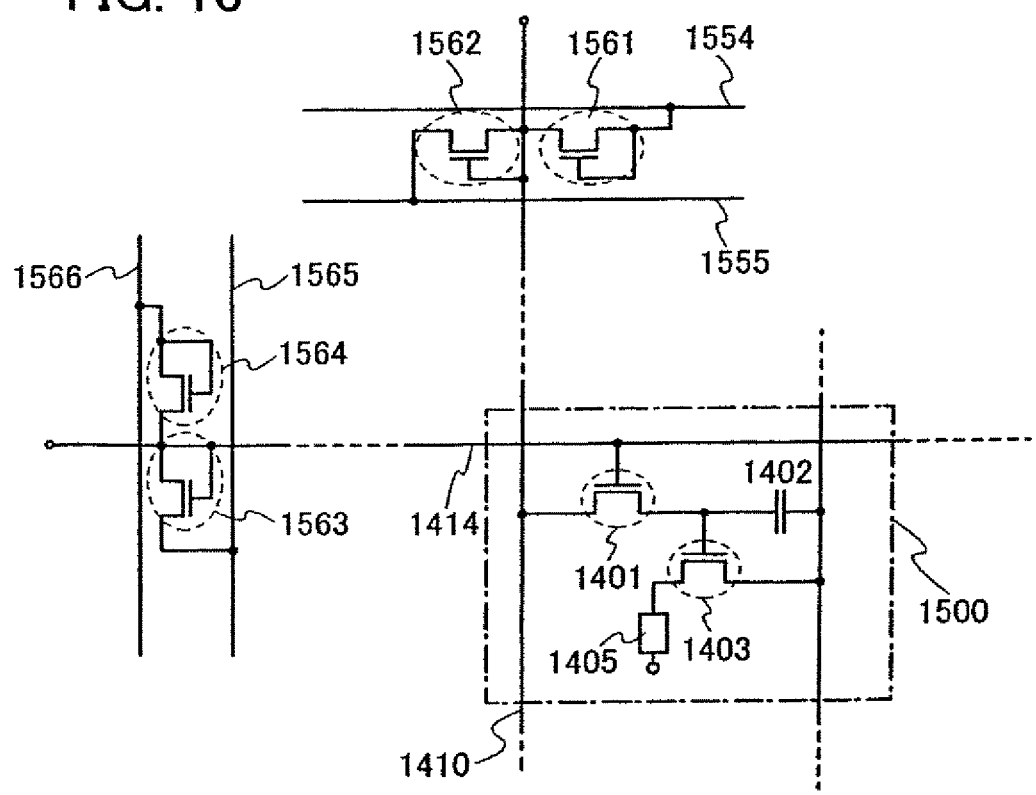
FIG. 13 shows an equivalent circuit of a light-emitting device.

In FIG. 13, the switching TFT 1401, the driving TFT 1403, the auxiliary capacitor 1402, and the light-emitting element 1405 are provided in a pixel area 1500. Diodes 1561 and 1562 are provided on the signal line 1410. In the similar way to the switching TFT 1401 and the driving TFT 1403, the diodes 1561 and 1562 are manufactured based on the above embodiments, and have a gate electrode, a semiconductor layer, a source electrode, a drain electrode, and the like. The diodes 1561 and 1562 are operated as diodes by connecting the gate electrode with the drain electrode or the source electrode.

Common potential lines 1554 and 1555 connecting to the diodes 1561 and 1562 are formed by using the same layer as the gate electrode. Therefore, in order to connect the common potential lines 1554 and 1555 with the source electrode or the drain electrode of the diode, it is necessary to form a contact hole in the gate insulating layer.

Diodes 1563 and 1564 provided on the scan line 1414 have a similar structure. Further, common potential lines 1565 and 1566 has the similar structure.

In this manner, protection diodes can be simultaneously formed in an input stage according to this invention. Further, the positions of the protection diodes are not limited to this, and they can be provided between a driver circuit and a pixel.

Figure 12E:
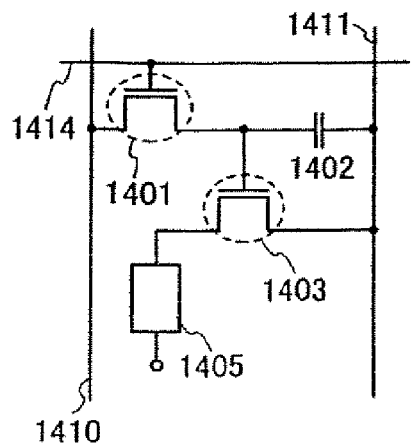
Figure 12F:
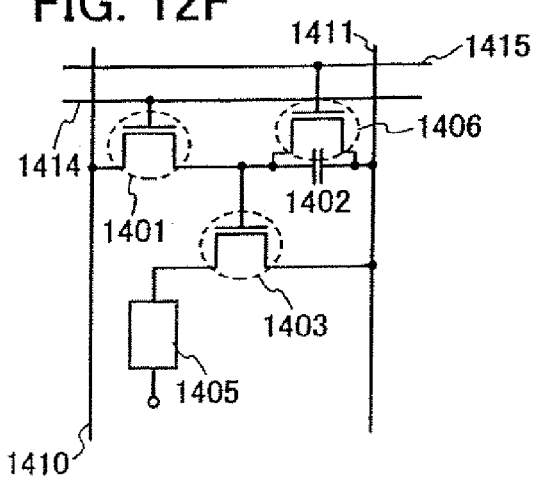

A top view of a pixel portion in the case of using an equivalent circuit shown in FIG. 12E is described in FIG. 14A. In addition, the same equivalent circuit as that in FIG. 12E is shown in FIG. 14B. Each semiconductor device shown in FIGS. 10A, 10B, 11A, and 11B is corresponds to each driving TFT 1403. FIGS. 10A, 10B, 11A and 11B show cross-sectional views taken along line X-Y in FIG. 14A and 14B. The power source line 1411, the signal line 1410, and the source electrode and the drain electrode of the switching TFT 1401 are formed by using the first conductive film, and the source electrode and the drain electrode of the driving TEF 1403 are formed by using the second conductive film.

The switching TF 1401 is manufactured by the same method as the driving TFT 1403. The drain electrode of the switching TFT 1401 and a gate electrode 40 of the driving TFT 1403 are connected electrically with each other through a contact hole formed in an insulating film in the same layer as the gate insulating film 42.

The auxiliary capacitor 1402 is formed by using a portion where the gate electrode of the driving TFT 1403 is extended, the power source line 1411, and an insulating film in the same layer as the gate insulating film 42.

A light-emitting region 1420 is formed in an opening portion of a partition wall 81. The partition wall 81 is formed in the vicinity of the light-emitting region 1420, although it is not shown. The corner portion of the light-emitting region 1420 may be rounded. By making the corner portion of the opening portion of the partition wall 81 rounded, the corner portion of the light-emitting region 1420 can be rounded. When dry etching using plasma is performed to process the partition wall 81, generation of fine particles due to abnormal discharge can be suppressed by making the corner portion rounded.

This embodiment can be combined with a suitable structure of the above embodiments as appropriate.

Embodiment 7

As an electronic device having semiconductor devices according to this invention mounted with modules shown as examples in the above embodiments, a camera such as a video camera or a digital camera; a goggle type display (a head mounted display); a navigation system; an audio reproducing device (e.g., a car audio component); a computer; a game machine; a portable information terminal (e.g., a mobile computer, a cellular phone, a portable game machine, an electronic book, or the like); an image reproducing device equipped with a recording medium (specifically, a device which can reproduce the content of a recording medium such as a digital versatile disc (DVD) and which has a display for displaying an image stored therein); and the like can be given. Specific examples of these electronic appliances are shown in FIGS. 15A to 15E, and FIG. 16.

Figure 15A:
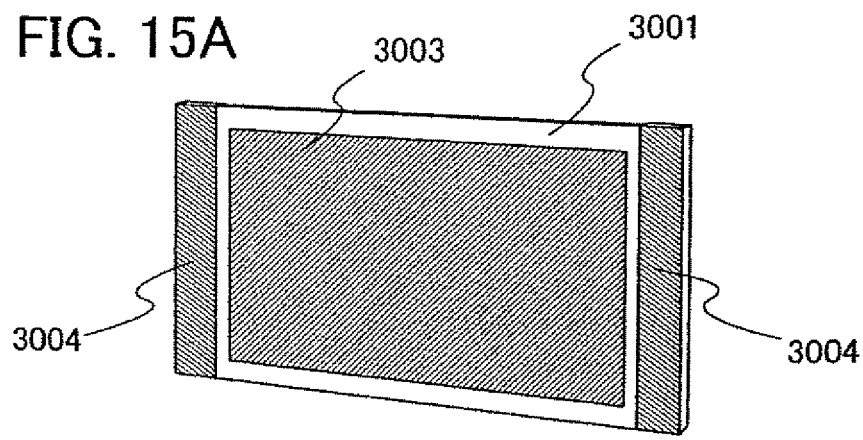
FIGS. 15A to 15E each show an example of an electronic apparatus to which this invention is applied.

FIG. 15A shows a monitor for a television receiver or a personal computer, or the like, including a housing 3001, a display area 3003, speakers 3004, and the like. An active matrix display device is provided in the display area 3003. Each pixel of the display area 3003 includes a semiconductor device manufactured in accordance with this invention. By using the semiconductor device of this invention with this structure, a television with less characteristic deterioration can be obtained.

Figure 15B:
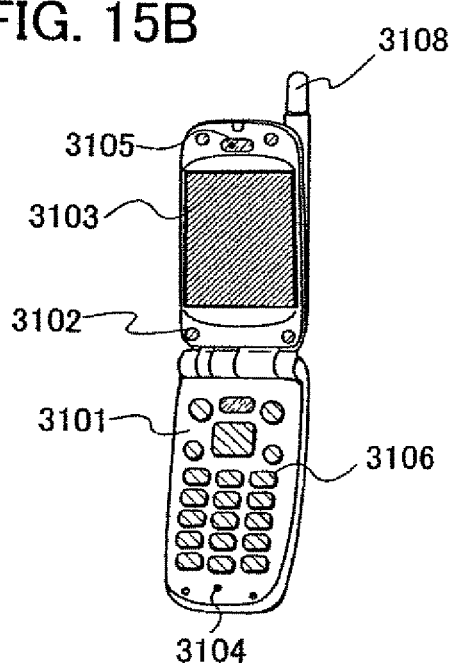

FIG. 15B shows a cellular phone, including a main body 3101, a housing 3102, a display area 3103, an audio input portion 3104, an audio output portion 3105, operation keys 3106, an antenna 3108, and the like. An active matrix display device is provided in the display area 3103. Each pixel of the display area 3103 includes a semiconductor device manufactured in accordance with this invention. By using the semiconductor device of this invention with this structure, a cellular phone with less characteristic deterioration can be obtained.

Figure 15C:
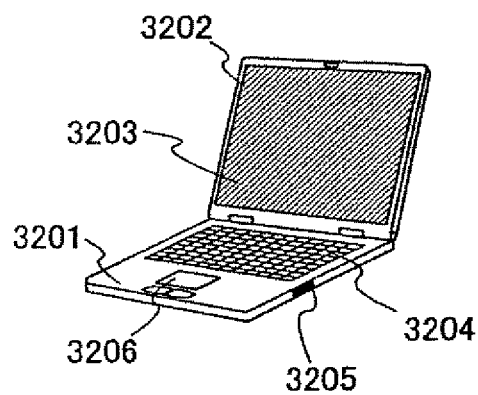

FIG. 15C shows a computer, including a main body 3201, a housing 3202, a display area 3203, a keyboard 3204, an external connection port 3205, a pointing mouse 3206, and the like. An active matrix display device is provided in the display area 3203. Each pixel of the display area 3203 includes a semiconductor device manufactured in accordance with this invention. By using the semiconductor device of this invention with this structure, a computer with less characteristic deterioration can be obtained.

Figure 15D:
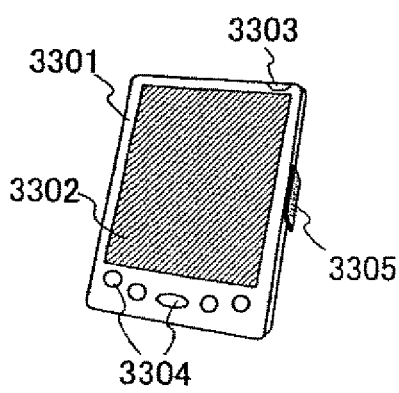

FIG. 15D shows a mobile computer, including a main body 3301, a display area 3302, a switch 3303, operation keys 3304, an infrared port 3305, and the like. An active matrix display device is provided in the display area 3302. Each pixel of the display area 3302 includes a semiconductor device manufactured in accordance with this invention. By using the semiconductor device of this invention with this structure, a mobile computer with less characteristic deterioration can be obtained.

Figure 15E:
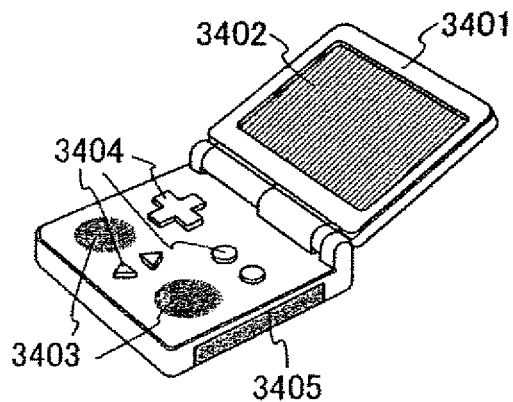

FIG. 15E shows a portable game machine, including a housing 3401, a display area 3402, speakers 3403, operation keys 3404, a recording medium insert portion 3405, and the like. An active matrix display device is provided in the display area 3402. Each pixel of the display area 3402 includes a semiconductor device manufactured in accordance with this invention. By using the semiconductor device of this invention with this structure, a portable game machine with less characteristic deterioration can be obtained.

Figure 16:
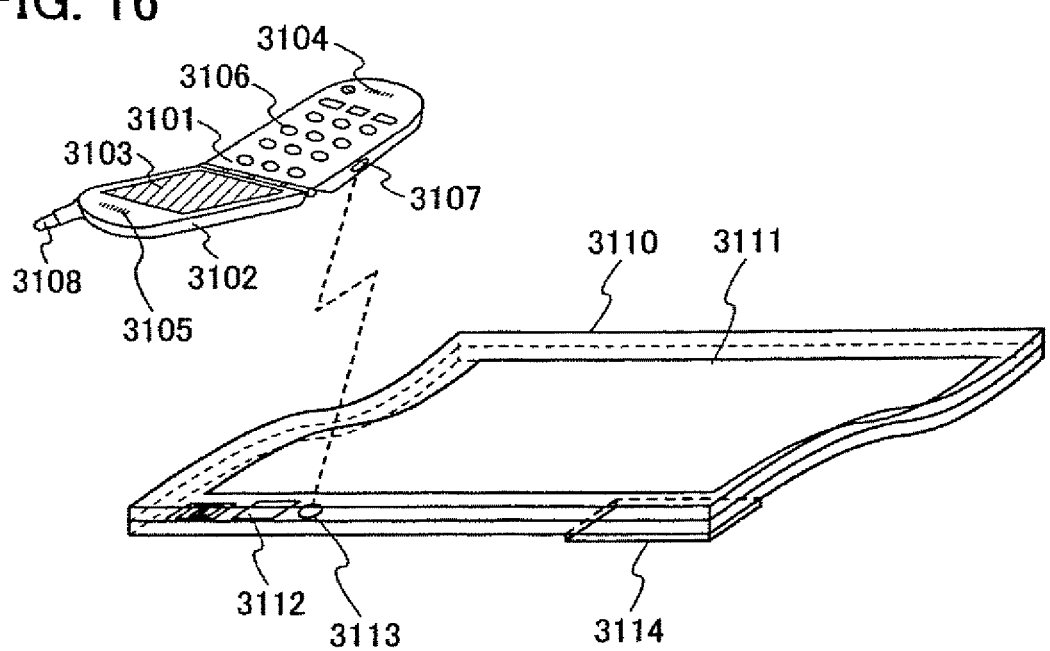
FIG. 16 shows an example of electronic apparatuses to which this invention is applied.

FIG. 16 shows a flexible display, including a main body 3110, a pixel area 3111, a driver IC 3112, a receiving device 3113, a film buttery 3114, and the like. The receiving device can receive a signal from an infrared communication port 3107 of the above described cellular phone. An active matrix display device is provided in the pixel area 3111. Each pixel of the pixel area 3111 includes a semiconductor device manufactured in accordance with this invention. By using the semiconductor device of this invention with this structure, a flexible display with less characteristic deterioration can be obtained.

As set forth above, the application range of this invention is extremely wide, and this invention can be applied to electronic devices in all fields.

The present application is based on Japanese Patent Application serial No. 2005-329806 filed on Nov. 15, 2005 in Japanese Patent Office, the entire contents of which are hereby incorporated by reference.

EXPLANATION OF REFERENCE

1: substrate, 2: insulating film, 3: gate electrode, 5: gate insulating film, 6: first conductive film, 7: second conductive film, 8: third conductive film, 9: resist mask, 10: source electrode, 10a: source electrode, first conductive film, 10b: source electrode, second conductive film, 11: drain electrode, 11a: drain electrode, first conductive film, 11b: drain electrode, second conductive film, 12: semiconductor film, 13: island-like shaped semiconductor film, 14: insulating film, 20: insulating film, 21: first conductive film, 22: second conductive film, 23: third conductive film, 24: resist mask, 25: source electrode, 25a: source electrode, first conductive film, 25b: source electrode, second conductive film, 26: drain electrode, 26a: drain electrode, first conductive film, 26b: drain electrode, second conductive film, 27: semiconductor film, 28: gate insulating film, 29: gate electrode, 30: insulting film, 40: gate electrode, gate wire, 41: auxiliary capacitor wire, 42: gate insulating film, 45: source electrode, 45a: source electrode, 45b: source electrode, 46: drain electrode, 46a: drain electrode, 46b: drain electrode, 47: source wire, 48: semiconductor film, 49: insulating film, 50: pixel electrode, 51: alignment wire, 52: liquid crystal composition, 53: alignment film, 54: protective insulating film, 55: color filter, 56: opposing substrate, 61: substrate, 62: gate wire driver circuit, 62a: shift register, 62b: buffer, 63: source wire driver circuit, 63a: shift register, 63b: buffer, 64: active matrix portion, 65: semiconductor device, 66: liquid crystal portion, 67: auxiliary capacitor, 68: video line, 69: analog switch, 71: source wire, 72: gate wire, 73: auxiliary capacitor wire, 75: sealant, 81: partition wall, 81a: end surface, 82: layer including light-emitting substance, 83: opposing electrode, 84: drying agent, 85: resin, 86: opposing substrate, 87: protective film, 88: polarizing plate, 100: auxiliary capacitor, 1000: substrate, 1001: source electrode, 1002: drain electrode, 1003: semiconductor film, 1004: gate insulating film, 1005: gate electrode, 1006: base film, 1401: switching TFT, 1402: auxiliary capacitor, 1403: driving TFT, 1404: current control TFT, 1405: light-emitting element, 1406: TFT, 1410: signal line, 1411: power source line, 1412: power source line, 1414: scan line, 1415: scan line, 1420: light-emitting region, 1500: pixel portion, 1554: common potential line, 1555: common potential line, 1561: diode, 1562: diode, 1563: diode, 1564: diode, 1565: common potential line, 1566: common potential line, 3001: housing, 3003: display area, 3004: speaker, 3101: main body, 3102: housing, 3102: housing, 3103: display area, 3104: audio input portion, 3105: audio output portion, 3106: operation keys, 3107: infrared communication port, 3108: antenna, 3110: main body, 3111: pixel portion, 3112: driver IC, 3113: receiving device, 3114: film buttery, 3201: main body, 3202: housing, 3203: display area, 3204: keyboard, 3205: external connection port, 3206: pointing mouse, 3301: main body, 3302: display area, 3303: switch, 3304: operation keys, 3305: infrared port, 3401: housing, 3402: display area, 3403: speakers, 3404: operation keys, 3405: recording medium insert portion

What is claimed is:

1. An active matrix display device comprising:
a thin film transistor over a substrate, the thin film transistor comprising:
a gate electrode;
a semiconductor film comprising zinc oxide over the gate electrode with a gate insulating film interposed therebetween;
an auxiliary wire over the substrate;
a first insulating film comprising silicon on the semiconductor film;
a second insulating film comprising a resin material on the first insulating film; and
a pixel electrode formed over the second insulating film and electrically connected to the thin film transistor,
wherein a corner of a portion where a width of the auxiliary wire changes is rounded.

2. The active matrix display device according to claim 1, wherein the gate insulating film comprises silicon oxide or silicon oxynitride.

3. The active matrix display device according to claim 1, wherein the insulating film comprising the resin material is formed by coating.

4. The active matrix display device according to claim 1, wherein the active matrix display device is an electroluminescent (EL) display device.

5. The active matrix display device according to claim 1, wherein the active matrix display device is a liquid crystal display device.

6. A television receiver including the active matrix display device according to claim 1.

7. The active matrix display device according to claim 1, wherein the semiconductor film has a thickness of 20 to 200 nm.

8. An active matrix display device comprising:
a gate wire over a substrate;
a thin film transistor over the substrate, the thin film transistor comprising:
a gate electrode;
a semiconductor film comprising zinc oxide over the gate electrode with a gate insulating film interposed therebetween;
a conductive film comprising an oxide in contact with the semiconductor film; and
a metal film in contact with the conductive film;
a first insulating film comprising silicon on the semiconductor film;
a second insulating film comprising a resin material on the first insulating film; and
a pixel electrode over the second insulating film and electrically connected to the thin film transistor, wherein the conductive film is between the semiconductor film and the metal film, and wherein a corner of a portion where a width of the gate wire changes is rounded.

9. The active matrix display device according to claim 8, wherein the metal film is aluminum film or aluminum alloy film.

10. The active matrix display device according to claim 8, wherein the conductive film comprises zinc oxide.

11. The active matrix display device according to claim 8, wherein the metal film is a Ti film.

12. The active matrix display device according to claim 8, wherein the metal film includes a first metal layer comprising aluminum and a second metal layer comprising titanium wherein the second metal layer is in contact with the conductive film.

13. The active matrix display device according to claim 8, wherein the gate insulating film comprises silicon oxide or silicon oxynitride.

14. The active matrix display device according to claim 8, wherein the insulating film comprising the resin material is formed by coating.

15. The active matrix display device according to claim 8, wherein the active matrix display device is an electroluminescent (EL) display device.

16. The active matrix display device according to claim 8, wherein the active matrix display device is a liquid crystal display device.

17. A television receiver including the active matrix display device according to claim 8.

18. The active matrix display device according to claim 8, wherein the semiconductor film has a thickness of 20 to 200 nm.

19. An active matrix display device comprising:
a thin film transistor over a substrate, the thin film transistor comprising:
  a gate electrode over the substrate;
  a gate insulating film over the gate electrode;
  a metal film over the substrate;
  a conductive film comprising an oxide on and in contact with the metal film; and
  a semiconductor film comprising zinc oxide on and in contact with the conductive film and the gate insulating film;

a source wire over the substrate, the source wire comprising:
  a first layer formed from a same layer as the metal film; and
  a second layer formed from a same layer as the conductive film;
a first insulating film comprising silicon on the semiconductor film;
a second insulating film comprising a resin material on the first insulating film; and
a pixel electrode over the second insulating film and electrically connected to the thin film transistor, wherein a corner of a portion where a width of the source wire changes is rounded.

20. The active matrix display device according to claim 19, wherein the metal film is aluminum film or aluminum alloy film.

21. The active matrix display device according to claim 19, wherein the conductive film comprises zinc oxide.

22. The active matrix display device according to claim 19, wherein the metal film is a Ti film.

23. The active matrix display device according to claim 19, wherein the metal film includes a first metal layer comprising aluminum and a second metal layer comprising titanium wherein the second metal layer is in contact with the conductive film.

24. The active matrix display device according to claim 19, wherein the gate insulating film comprises silicon oxide or silicon oxynitride.

25. The active matrix display device according to claim 19, wherein the insulating film comprising the resin material is formed by coating.

26. The active matrix display device according to claim 19, wherein the active matrix display device is an electroluminescent (EL) display device.

27. The active matrix display device according to claim 19, wherein the active matrix display device is a liquid crystal display device.

28. A television receiver including the active matrix display device according to claim 19.

29. The active matrix display device according to claim 19, wherein the semiconductor film has a thickness of 20 to 200 nm.

* * * * *

UNITED STATES PATENT AND TRADEMARK OFFICE
CERTIFICATE OF CORRECTION

PATENT NO. : 8,525,165 B2
APPLICATION NO. : 12/417682
DATED : September 3, 2013
INVENTOR(S) : Kengo Akimoto It is certified that error appears in the above-identified patent and that said Letters Patent is hereby corrected as shown below:

In the Specification:

Col. 5, line 53, "conductive film ha" should read "conductive film 11*a*"

Col. 5, line 58, "P phosphorus)," should read "P (phosphorus),"

Col. 8, line 38, "300°0 C." should read "300 °C."

Col. 9, line 51, "1 82 m" should read "1 µm"

Col. 11, line 63, "350°0 C." should read "350 °C"

Col. 12, line 40, "an AlNi film" should read "an AlNi film"

Col. 13, line 47, "FIG. 5B" should read "FIG. 8B"

Col. 16, line 8, "phenylaminoπtriphenylamine" should read "phenylamino]triphenylamine"

Col. 16, line 23, "10 cm$^2$Vs" should read "10 cm$^2$/Vs"

Col. 17, line 24, "(4-etbylphenyl)" should read "(4-ethylphenyl)"

Col. 19, line 26, "light emitting clement." should read "light emitting element."

Col. 20, line 55, "clement 1405." should read "element 1405."

Col. 20, line 61, "FIC 12E" should read "FIG. 12E"

Signed and Sealed this
Twenty-fifth Day of February, 2014

Michelle K. Lee
*Deputy Director of the United States Patent and Trademark Office*

CERTIFICATE OF CORRECTION (continued)
U.S. Pat. No. 8,525,165 B2

Col. 21, line 54, "driving TFF" should read "driving TFT"

Col. 21, line 56, "switching TF 1401" should read "switching TFT 1401"